(12) United States Patent
Shimomura et al.

(10) Patent No.: US 9,299,943 B2
(45) Date of Patent: Mar. 29, 2016

(54) GLASS PATTERN AND METHOD FOR FORMING THE SAME, SEALED BODY AND METHOD FOR MANUFACTURING THE SAME, AND LIGHT-EMITTING DEVICE

(71) Applicant: Semiconductor Energy Laboratory Co., Ltd., Kanagawa-ken (JP)

(72) Inventors: Akihisa Shimomura, Kanagawa (JP); Kensuke Yoshizumi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/686,157

(22) Filed: Nov. 27, 2012

(65) Prior Publication Data

US 2013/0134396 A1 May 30, 2013

(30) Foreign Application Priority Data

Nov. 28, 2011 (JP) ................................. 2011-259401

(51) Int. Cl.
| | |
|---|---|
| *H01L 21/00* | (2006.01) |
| *H01L 51/50* | (2006.01) |
| *C03B 23/203* | (2006.01) |
| *C03B 23/24* | (2006.01) |
| *H01L 51/52* | (2006.01) |

(52) U.S. Cl.
CPC .......... *H01L 51/5012* (2013.01); *C03B 23/203* (2013.01); *C03B 23/24* (2013.01); *H01L 51/5246* (2013.01); *Y02P 40/57* (2015.11); *Y10T 428/1317* (2015.01); *Y10T 428/197* (2015.01)

(58) Field of Classification Search
CPC .................. H01L 2924/16251; H01L 51/5012
USPC ........................................................ 438/125
See application file for complete search history.

(56) References Cited

U.S. PATENT DOCUMENTS

| | | | | |
|---|---|---|---|---|
| 5,278,429 | A | * | 1/1994 | Takenaka et al. ............. 257/678 |
| 5,515,473 | A | * | 5/1996 | Yamauchi et al. ............ 385/138 |
| 5,785,569 | A | * | 7/1998 | Stansbury et al. .............. 445/25 |
| 6,113,450 | A | | 9/2000 | Narayanan et al. |
| 6,860,780 | B2 | | 3/2005 | Miyashita et al. |
| 6,984,159 | B1 | | 1/2006 | Kado et al. |
| 7,121,642 | B2 | | 10/2006 | Stoessel et al. |
| 7,431,628 | B2 | | 10/2008 | Park et al. |
| 7,780,493 | B2 | | 8/2010 | Choi et al. |
| 7,837,530 | B2 | | 11/2010 | Park |
| 7,868,540 | B2 | | 1/2011 | Kim |

(Continued)

FOREIGN PATENT DOCUMENTS

| | | |
|---|---|---|
| JP | 2011-65895 | 3/2011 |
| JP | 2011-111353 | 6/2011 |

*Primary Examiner* — Ajay K Arora

(74) *Attorney, Agent, or Firm* — Husch Blackwell LLP

(57) ABSTRACT

A glass pattern that can be used for a substrate provided with a material having low heat resistance and has increased productivity is provided. Further, a sealed body having high hermeticity and increased productivity is provided. Furthermore, a light-emitting device with high reliability including such a sealed body is provided. A glass sheet is used for a main portion of a glass pattern such as a straight line portion and a curved portion. In a joint portion of two glass sheets arranged in the corner portion, the straight line portion, or the like of the glass pattern, a frit paste is provided in contact with the glass sheets and is locally heated to remove the binder from the frit paste and to form a glass layer; thus, the glass sheets are fused to each other without any space provided therebetween.

18 Claims, 12 Drawing Sheets

(56) References Cited

U.S. PATENT DOCUMENTS

| | | |
|---|---|---|
| 7,871,949 B2 | 1/2011 | Lee et al. |
| 8,125,146 B2 | 2/2012 | Park |
| 8,164,257 B2 | 4/2012 | Choi et al. |
| 2002/0018627 A1* | 2/2002 | Kato et al. .................. 385/93 |
| 2005/0035715 A1* | 2/2005 | Kado et al. .................. 313/582 |
| 2005/0037184 A1* | 2/2005 | Halsey et al. ................ 428/210 |
| 2007/0090760 A1* | 4/2007 | Seon .............................. 313/562 |
| 2007/0114909 A1* | 5/2007 | Park et al. .................... 313/495 |
| 2010/0035503 A1* | 2/2010 | Kim et al. ....................... 445/25 |
| 2012/0070618 A1 | 3/2012 | Sakamoto et al. |
| 2012/0095582 A1 | 4/2012 | Chen et al. |
| 2012/0240633 A1 | 9/2012 | Matsumoto |
| 2012/0285200 A1 | 11/2012 | Tanaka |
| 2012/0318023 A1 | 12/2012 | Shimomura |
| 2012/0319092 A1 | 12/2012 | Shimomura |
| 2013/0101754 A1 | 4/2013 | Shimomura et al. |

* cited by examiner

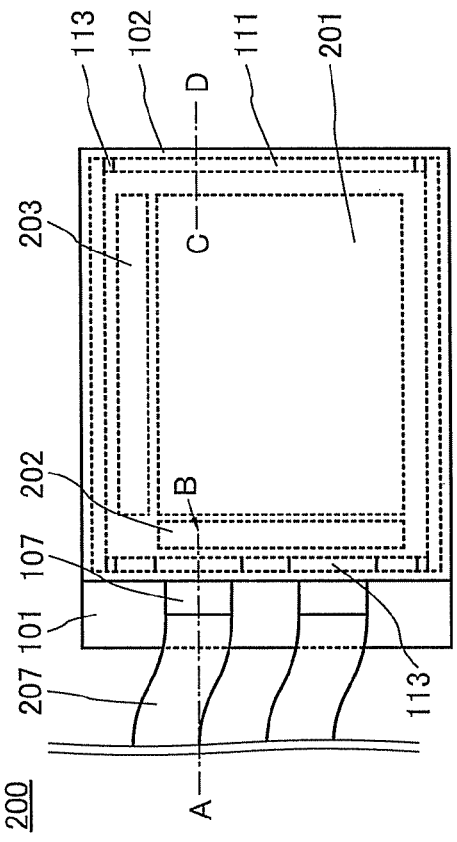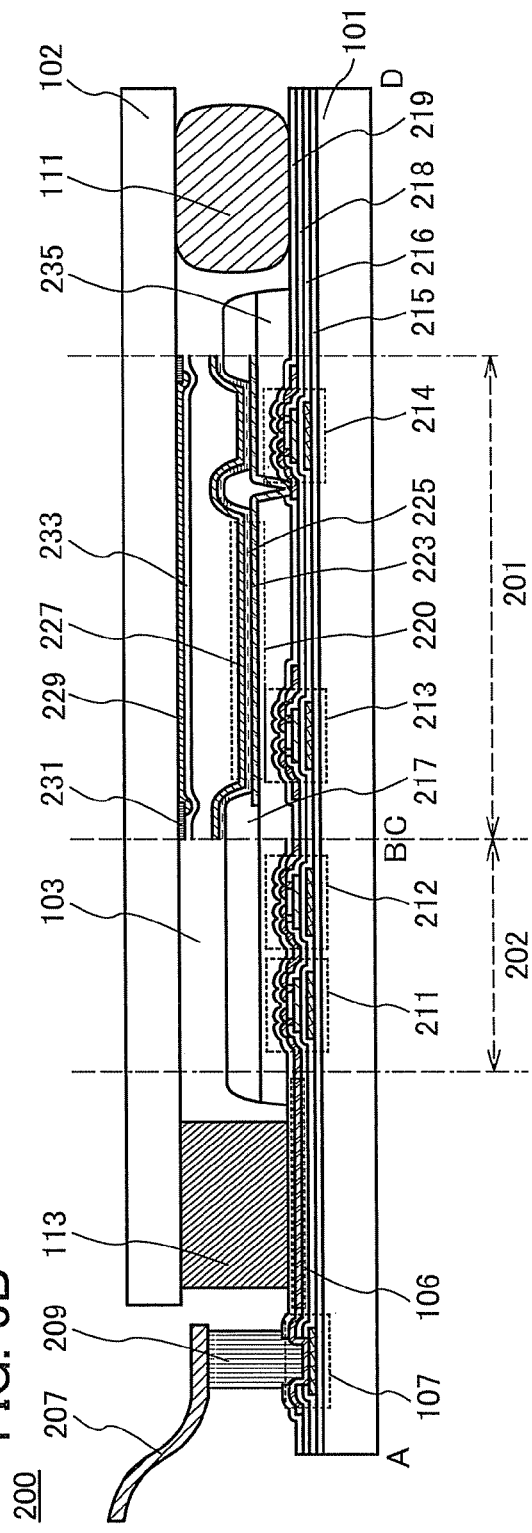

GLASS PATTERN AND METHOD FOR FORMING THE SAME, SEALED BODY AND METHOD FOR MANUFACTURING THE SAME, AND LIGHT-EMITTING DEVICE

BACKGROUND OF THE INVENTION

1. Field of the Invention

The present invention relates to a sealed body and a method for manufacturing the sealed body. In addition, the present invention relates to a light-emitting device.

2. Description of the Related Art

A technique of forming a highly airtight sealed body by bonding two substrates to each other with glass (hereinafter also referred to as a glass layer) obtained by melting or sintering glass frit including low-melting glass has been known. In a technique disclosed in Patent Document 1, a paste containing a binder and glass frit including low-melting glass is applied to a glass substrate along an edge of the glass substrate, the binder is removed and the glass frit is melted to form a glass layer by baking of the paste, and the glass layer is irradiated with laser light with the substrate overlapping with a counter substrate so that the substrate and the counter substrate are bonded to each other with the glass layer provided therebetween; thus, a highly airtight sealed body is formed.

A baking furnace or the like is generally used in a method for removing a binder by baking of a paste; moreover, as another method, Patent Document 2 discloses a method for gasifying a binder using laser light.

Since such a glass layer has a high gas barrier property, a sealed space can be kept away from the external atmosphere. A method for sealing with such a glass layer is used for a device including an element such as an organic EL (electroluminescence) element, an organic semiconductor element, or an organic solar cell, whose performance is rapidly decreased once the element is exposed to the air (including, moisture or oxygen).

As examples of the device including the organic EL element, a lighting device including the organic EL element as a light source, an image display device in which a thin film transistor and an organic EL element are combined, and the like can be given. Since the organic EL element can be formed in a film shape and thus easily increased in area, it is suitable for a lighting device having a planar light source, a large-sized image display device (e.g., television set), or the like. In addition, an image display device including an organic EL element needs no backlight which is necessary for liquid crystal display devices and the like; therefore, thin, lightweight, high contrast, and low power consumption display devices can be obtained.

REFERENCE

[Patent Document 1] Japanese Published Patent Application No. 2011-065895

[Patent Document 2] Japanese Published Patent Application No. 2011-111353

SUMMARY OF THE INVENTION

In a method for manufacturing a sealed body including a glass layer formed of glass frit, baking for removing a binder is necessary after a paste containing glass frit and the binder (hereinafter the paste is also referred to as a frit paste) is applied to a substrate as described above, in order to form a glass pattern of the glass layer over the substrate. By removing the binder through the baking, the formed glass layer can have a high barrier property. Although baking temperature depends on the material, baking at a high temperature of approximately 350° C. to 450° C. generally needs to be performed for removing the binder.

On the other hand, a substrate to which a frit paste is applied cannot be baked at high temperature in some cases. As examples, a case where a material having low heat resistance is provided over the substrate, a case where a functional circuit which is easily affected by heat is provided over the substrate, and the like are given. As an example of a material having low heat resistance used in a device including an organic EL element, an organic EL element, a color filter, an optical adjustment layer such as a microlens array provided in order to improve light extraction efficiency, or the like can be given. Further, a semiconductor circuit for driving an organic EL element is provided over a substrate in some cases. In addition, a functional element including an organic material, such as an organic semiconductor element or an organic solar cell, can be given.

Here, according to a method described in Patent Document 2, a frit paste fanned along the periphery of a substrate is locally heated by scanning with laser light, so that a binder can be removed; thus, it is possible to form a glass pattern without baking of the entire substrate at high temperature. However, in order to remove the binder in the paste completely with the use of laser light, laser irradiation is needed for a certain period until the binder is vaporized and released; therefore, the scanning speed cannot be increased. In the case of increasing the beam intensity of the laser light to remove the binder in a short period, when the beam intensity is too high, a sudden temperature change causes a crack in the substrate; therefore, the beam intensity cannot be well increased. Consequently, in the case of using such a process of baking a frit paste by scanning with laser light, there is a problem in that the productivity cannot be increased.

At the time of overlapping a substrate provided with a glass pattern with a counter substrate, when a glass layer included in the glass pattern has a non-uniform thickness, a space is formed between the glass layer and the counter substrate which are welded to each other, resulting in a decrease in the hermeticity. For this reason, it is desirable that a frit paste is applied to have a uniform thickness. In the case of applying a frit paste along the periphery of a substrate, however, it has been difficult to apply the frit paste to have a uniform thickness by a coating method such as a dispensing method, for example. The frit paste can be applied to have a substantially uniform thickness by a printing method such as a screen printing method; however, there have been problems in that an expensive printing plate needs to be used, and the printing method cannot be used particularly for a large-sized substrate.

The present invention is made in view of the foregoing technical background. Thus, an object of one embodiment of the present invention is to provide a glass pattern that can be used for a substrate provided with a material having low heat resistance and has increased productivity. Further, an object of one embodiment of the present invention is to provide a sealed body having high hermeticity and increased productivity. Furthermore, an object of one embodiment of the present invention is to provide a light-emitting device with high reliability including such a sealed body.

One embodiment of the present invention achieves at least one of the above objects.

In order to achieve the above objects, part of a glass pattern is formed with the use of a glass sheet which is a strip-like thin film. The glass sheet is used for a main portion of the glass pattern, such as a straight line portion and a curved portion. In addition, in a joint portion of two glass sheets arranged in a corner portion or a straight line portion of the glass pattern, a frit paste is provided in contact with the glass sheets, and the frit paste is locally heated to remove a binder from the frit paste and to form a glass layer; thus, the glass sheets are fused to each other without any space but with the glass layer provided therebetween.

As the glass sheet, a glass sheet which does not include a binder, which is included in the frit paste, is used. For this reason, a portion where the glass sheet is provided does not need to be subjected to heat treatment for removing the binder. Such a glass sheet is used in the main portion and the glass layer is used in part of the joint portion or the like; thus, only part of the frit paste is locally heated, resulting in an increase in the productivity. In particular, in the case of a process of baking with laser light, treatment can be completed in a very short time.

A method for forming a glass pattern which is one embodiment of the present invention includes the following steps: providing a first glass sheet and a second glass sheet over one plane; applying a fit paste including glass frit and a binder; and heating the frit paste to remove the binder from the frit paste and to form a glass layer. A space is provided between the first glass sheet and the second glass sheet so that a side surface of the first glass sheet and a side surface of the second glass sheet, which face each other, are not in contact with each other. The frit paste is provided to be in contact with the side surface of the first glass sheet and the side surface of the second glass sheet and to fill the space.

Further, a method for forming a glass pattern which is one embodiment of the present invention includes the following steps: providing a plurality of glass sheets over one plane; applying a frit paste including glass frit and a binder; and heating the frit paste to remove the binder from the frit paste and to form a glass layer. A space is provided between the plurality of glass sheets so that side surfaces facing each other of two of the glass sheets, which are adjacent, are not in contact with each other. The frit paste is provided to be in contact with the side surfaces of the plurality of glass sheets and to fill the space. The plurality of glass sheets and the glass layer form a closed curve.

As described above, the plurality of glass sheets is provided apart from each other so as to surround one region, and the glass layer is formed to fill a region where the plurality of glass sheets is apart from each other; thus, a glass pattern forming a closed curve surrounding the one region can be Mimed. In addition, the area of a region where the frit paste is provided can be very small; therefore, the glass pattern can be formed in a short time. By using the glass, sheets in a main portion, the uniformity of the thickness can be easily increased.

A glass pattern which is one embodiment of the present invention includes a first glass sheet, a second glass sheet, and a glass layer including glass frit, which are formed over one plane. A space is provided between the first glass sheet and the second glass sheet so that a side surface of the first glass sheet and a side surface of the second glass sheet, which face each other, are not in contact with each other. The glass layer is in contact with the side surface of the first glass sheet and the side surface of the second glass sheet and fills the space.

Further, a glass pattern which is one embodiment of the present invention includes a plurality of glass sheets and a glass layer including glass frit, which are provided in one plane. A space is provided between the plurality of glass sheets so that side surfaces facing each other of two of the glass sheet, which are adjacent, are not in contact with each other. The glass layer is in contact with the side surfaces of the plurality of glass sheets and fills the space. The plurality of the glass sheets and the glass layer form a closed curve.

With the use of any of the above methods for forming the glass pattern, which are embodiments of the present invention, even when glass sheets are used, a joint portion of the glass sheets is filled effectively; thus, a glass pattern in which no space is provided between the glass sheets can be formed. By using the glass sheets in a main portion, the uniformity of the thickness can be increased in the glass pattern.

A method for manufacturing a sealed body which is one embodiment of the present invention includes the following steps: providing a plurality of glass sheets along a periphery of a first substrate; applying a frit paste including glass frit and a binder; heating the frit paste to remove the binder from the frit paste and to form a glass layer; providing a second substrate facing the first substrate to be in contact with top surfaces of the plurality of glass sheets and a top surface of the glass layer; and heating the plurality of glass sheets and the glass layer so that the first substrate and the second substrate are bonded to each other. A space is provided between the plurality of glass sheets so that side surfaces facing each other of two of the glass sheets, which are adjacent, are not in contact with each other. The frit paste is provided to be in contact with the side surfaces of the plurality of glass sheets and to fill the space. A closed space surrounded by the first substrate, the second substrate, the glass sheet, and the glass layer is formed.

The area of a region where a frit paste is provided is greatly reduced by manufacturing a sealed body by such a method; therefore, the time of a coating step and a baking step of the frit paste can be shortened, resulting in an increase in the productivity.

A sealed body which is one embodiment of the present invention includes a first substrate and a second substrate provided to face each other, and a plurality of glass sheets and a glass layer including glass frit which are sandwiched between the first substrate and the second substrate. A space is provided between the plurality of glass sheets so that side surfaces facing each other of two of the glass sheet, which are adjacent, are not in contact with each other. The glass layer is in contact with the side surfaces of the plurality of glass sheets and fills the space. A closed space surrounded by the first substrate, the second substrate, the plurality of glass sheets, and the glass layer is included.

In a sealing portion of such a sealed body manufactured by the above method, the uniformity of the thickness is increased by the glass sheets provided in a main portion and a space between the glass sheets is effectively filled with the glass layer provided between the glass sheets; thus, the sealed body can have very high hermeticity.

A light-emitting device which is one embodiment of the invention includes the above sealed body in which a light-emitting unit including an organic electroluminescence element is provided in the closed space.

Since the above sealed body, which is one embodiment of the present invention, has very high hermeticity, a device with extremely high reliability can be provided by including the sealed body in a device including a functional element formed of an organic material, such as an organic EL element.

In the light-emitting device which is one embodiment of the present invention, a wiring electrically connected to the light-emitting unit is provided to extend from the closed space to the outside, and the glass sheets do not overlap with the wiring and the glass layer is provided to overlap with the wiring.

In the case where an extraction wiring of the light-emitting unit is provided, a glass layer including glass frit is used in a region overlapping with the extraction wiring, whereby a step due to the extraction wiring or the like can be effectively covered and the hermeticity can be maintained; therefore, the light-emitting device can have high reliability.

Note that a "closed curve" in this specification and the like means a continuous curve with no end points. Further, here, a "curve" includes concepts of a straight line and a line segment in its broad sense. Therefore, the case where a plurality of line segments is included and every end point of the line segments overlaps with another end point, such as a periphery of a quadrangle, is also one mode of the closed curve. Further, a polygon, a circle, an ellipse, a shape in which a plurality of curves having different curvatures is continuously connected, a shape including a straight line and a curve, or the like is also one mode of the closed curve.

Note that an "EL layer" in this specification and the like means a layer provided between a pair of electrodes of a light-emitting element, and specifically means at least a layer containing a light-emitting organic compound (also referred to as a light-emitting layer), or a stack including the light-emitting layer.

Note that a light-emitting device in this specification refers to an image display device or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted over a substrate over which a light-emitting element is formed by a chip on glass (COG) method.

According to the present invention, a glass pattern that can be used for a substrate provided with a material having low heat resistance and has increased productivity can be provided. Further, a sealed body having high hermeticity and increased productivity can be provided. Furthermore, a light-emitting device with high reliability including such a sealed body can be provided.

BRIEF DESCRIPTION OF THE DRAWINGS

FIGS. 6A and 6B show a light-emitting device of one embodiment of the present invention.

DETAILED DESCRIPTION OF THE INVENTION

Figure 1A:
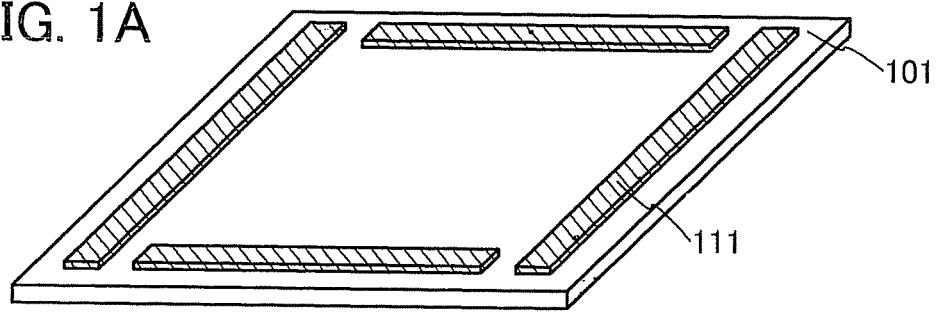
FIGS. 1A to 1D show a method for forming a glass pattern of one embodiment of the present invention.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

(Embodiment 1)

In this embodiment, a method for forming a glass pattern of one embodiment of the present invention and a method for manufacturing a sealed body of one embodiment of the present invention will be described with reference to drawings.

[Example of Manufacturing Process]

FIGS. 1A to 1D are schematic views showing an example of steps in the method for forming a glass pattern and the method for manufacturing a sealed body, which are described as examples in this embodiment.

First, a plurality of glass sheets 111 is arranged over a first substrate 101 (FIG. 1A).

The glass sheet 111 is a glass material which is a strip-like thin film. A glass sheet whose top surface and bottom surface have high flatness is preferably used as the glass sheet 111. A material, a structure, and the like which can be used for the glass sheet 111 will be described below in detail.

The glass sheets 111 are arranged over one surface of the first substrate 101 to surround a sealed region 103 formed later. For example, as shown in FIG. 1A, each of the glass sheets 111 is arranged as a straight line along each corresponding side of the periphery of the first substrate 101. Note that in the case where the glass sheet 111 has a narrow width and flexibility in the width direction, the glass sheet 111 may be provided not as a straight line but as a curved line.

Here, the two adjacent glass sheets 111 are provided apart from each other so as not to overlap with each other. When the glass sheets 111 overlap with each other, regions with different heights are formed in a glass pattern formed later or an interstice or the like is formed between part of the glass pattern and the first substrate 101, which might cause loss of hermeticity at the time of manufacturing a sealed body later.

Note that in FIG. 1A, the glass sheets 111 are arranged so that the two glass sheets 111 are perpendicular to each other and a region where the two glass sheets 111 are apart from each other is provided in a corner portion of the glass pattern. However, one embodiment of the present invention is not limited to this and the region may be provided in a straight line portion. Alternatively, the glass sheet 111 may be provided as a curved line to surround the sealed region 103 formed later. In that case, the glass sheet 111 is provided so that both end points thereof are apart from each other and do not overlap with each other.

Note that a method for arranging the glass sheets 111 over the first substrate 101 will be described later in detail.

Figure 1B:
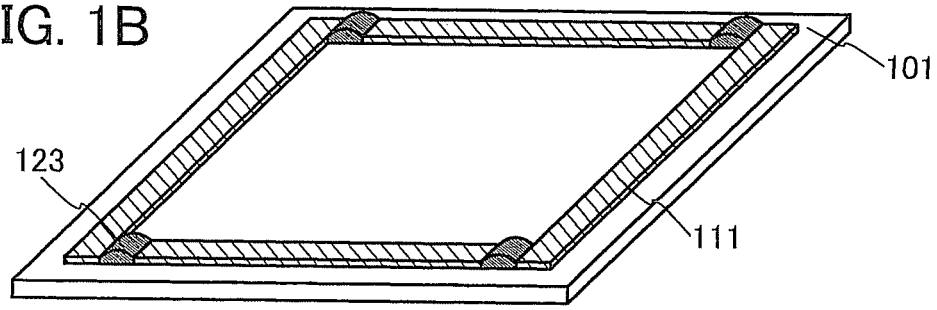

Next, a frit paste 123 is applied to fill a region where the two glass sheets 111 are apart from each other (FIG. 1B).

The fit paste 123 is a mixture of glass frit formed of powdered glass and a binder funned of an organic resin diluted with an organic solvent, for example. The frit paste 123 can be selectively applied by a known method, i.e., a coating method such as a dispensing method and an ink-jet method and a printing method such as a screen printing method. In particular, when a large-sized substrate is used, a coating method such as a dispensing method is preferably used.

A glass material used for the glass frit preferably contains one or more compounds selected from, for example, the following group: magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, antimony oxide, lead borate glass, tin phosphate glass, vanadate glass, and borosilicate glass. In addition, in the case where laser irradiation is used in heat treatment performed later, glass frit to which a laser light absorbent material is added is preferably used. The laser light absorbent material is selected as appropriate depending on the wavelength of the laser light used.

The frit paste 123 is provided in contact with part of a side surface of each of the glass sheets 111 to fill the region where the two glass sheets 111 are apart from each other. In such a manner, the frit paste 123 fills the region where the glass sheets 111 are apart from each other, whereby the glass pattern in which no space is provided between the glass sheets can be formed.

Here, the height (thickness) of the frit paste 123 is preferably adjusted so that the thickness of the frit paste 123 from which the binder is removed in a subsequent heating step is approximately equal to the height of the glass sheet 111. After the binder is removed, the volume of the glass layer is contracted; therefore, it is preferable to form the frit paste 123 to have a larger thickness than the glass sheet 111. Further, for example, after the frit paste 123 is applied by a dispensing method or the like, a flat plate or the like may be pressed against the frit paste 123 or a top surface of the frit paste 123 may be flattened with the use of a spatula or the like so that the frit paste 123 has a uniform height and improved flatness.

Note that although the width of the frit paste 123 is approximately equal to the width of the glass sheet 111 in FIG. 1B, one embodiment of the present invention is not limited thereto. The width of the frit paste 123 may be larger or smaller than the width of the glass sheet 111. Alternatively, the frit paste 123 can be formed to have a large width in advance, and the width is decreased to be the same as or smaller than or equal to the width of the glass sheet 111 by utilizing an increase in the thickness of a central portion due to surface tension when the glass frit is melted and aggregated in the heating step of the frit paste 123.

Figure 1C:
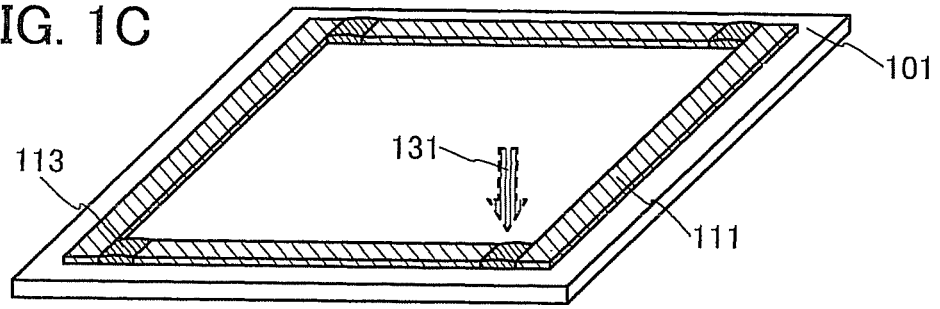

Next, the frit paste 123 is locally heated to remove the binder, so that a glass layer 113 is formed (FIG. 1C).

The frit paste 123 is preferably heated by a method capable of local heating. The frit paste 123 is preferably heated by laser irradiation. Alternatively, in other methods, the frit paste 123 may be heated in such a manner that a light-blocking mask is provided over a region other than a region to be heated and the frit paste 123 is irradiated with light from above, or an electrically conductive material is provided in the frit paste 123 or a region overlapping with the frit paste 123 and induction heating is performed. Here, laser light 131 is used to locally heat the frit paste 123.

Here, since the frit paste 123 is formed only in the region where the glass sheets 111 are apart from each other, even when the frit paste 123 is heated with the use of the laser light 131, the time of the heating step can be very short, resulting in an increase in the productivity. In addition, scanning with the laser light 131 is not needed when a spot diameter of the laser light 131 is larger than an area occupied by the fit paste 123; thus, a structure of an apparatus for laser irradiation can be simplified.

Through the heating step, the binder in the frit paste 123 is removed, so that the glass layer 113 is formed. In the glass layer 113 at this stage, the glass fit may be completely melted and then solidified to be aggregated or part of the glass frit may be welded to be porous. In addition, part of a component of the binder remains in some cases.

Through the heating step, part of an end portion of the glass sheet 111 may be melted and welded to the glass layer 113.

Thus, the glass pattern including the glass sheet 111 and the glass layer 113 can be formed over the first substrate 101. According to such a method, even in the case where the first substrate 101 is provided with a material having low heat resistance, the glass pattern can be formed without the material being affected by heat. The use of the glass sheet 111 in a main portion greatly reduces the area of a region where the frit paste 123 which needs to be heated is provided; therefore, the heating step for removing the binder can be easily performed, and the glass pattern can be formed with high productivity.

Figure 1D:
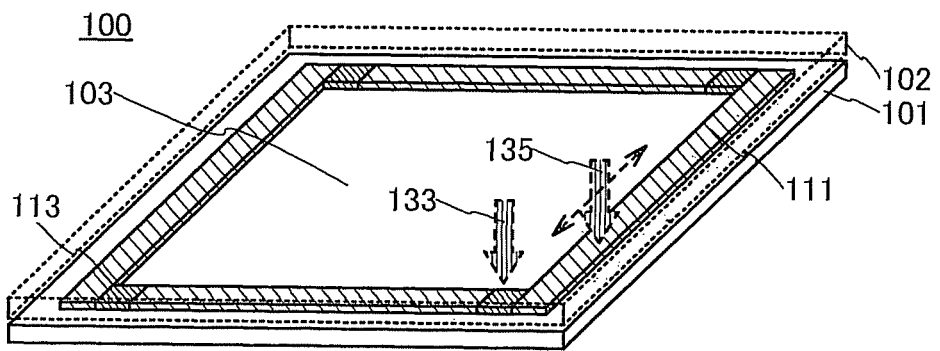

Next, a second substrate 102 is provided in contact with top surfaces of the glass sheet 111 and the glass layer 113. Then, the glass layer 113 and the glass sheet 111 are locally heated, whereby a sealed body is manufactured (FIG. 1D). Note that the second substrate 102 is shown by a dashed line in FIG. 1D for easy understanding.

As a method for locally heating the glass layer 113 and the glass sheet 111, a method similar to the method for heating the frit paste 123 can be used. Here, each of the glass layer 113 and the glass sheet 111 is locally heated by laser irradiation. By locally heating each of the glass sheet 111 and the glass layer 113, the first substrate 101 and the second substrate 102 are bonded to each other with the glass layer 113 and the glass sheet 111 provided therebetween, whereby the sealed body having high hermeticity can be manufactured. Here, it is preferable that a softening point (or a melting point) of the glass sheet 111 be lower than softening points (or melting points) of the first substrate 101 and the second substrate 102. With the use of a material having a low melting point for the glass sheet 111, the first substrate 101 and the second substrate 102 can be easily bonded to each other. In addition, the softening point (or a melting point) of the glass sheet 111 is preferably close to a softening point (or a melting point) of the glass layer 113, in which case the glass sheet 111 can be heated under conditions similar to those of the glass layer 113.

Here, the glass sheet 111, the glass layer 113, and the second substrate 102 are preferably treated while a pressure is applied so that they can be in contact with each other without fail. The glass sheet 111 and the glass layer 113 may be treated while the first substrate 101 and the second substrate 102 are interposed using a clamp or the like outside the region irradiated with the laser light, or may be treated while a pressure is applied to a substrate surface from one or both of the first substrate 101 and the second substrate 102.

Further, the inside of the sealed region 103 is preferably brought into an inert gas atmosphere or a reduced pressure atmosphere after the laser irradiation. For example, before the laser irradiation, a sealing material such as an ultraviolet curable resin or a thermosetting resin is formed in advance outside or inside a region where the glass sheet 111 is provided and a region where the frit paste 123 is applied; and the two substrates are temporarily bonded to each other with the sealing material in an inert gas atmosphere or a reduced pressure atmosphere and then irradiated with laser light in an air atmosphere or an inert gas atmosphere. When the sealing material is provided to form a closed curve, a structure of an apparatus for laser irradiation can be simplified because the inside of the sealed region 103 is kept in an inert gas atmosphere or a reduced pressure atmosphere and the laser irradiation can be performed in an air atmosphere. Further, when the inside of the sealed region 103 is brought into a reduced pressure atmosphere in advance, the laser irradiation can be performed while the glass sheet 111, the glass layer 113, and the second substrate 102 are in contact with each other without fail in an air atmosphere, without using a mechanism such as a clamp for pressing the two substrates.

The glass layer 113 is irradiated with laser light 133 through the first substrate 101 and the second substrate 102. A structure similar to that of the laser light 131 can be used for the laser light 133, and a region where the glass layer 113 is provided can be locally irradiated without scanning with the laser light 133 when a spot diameter thereof is large.

The glass sheet 111 is irradiated with laser light 135 while the glass sheet 111 is scanned with the laser light 135 along the region where the glass sheet 111 is provided. In FIG. 1D, a scanning direction of the laser light 135 is schematically shown by a dashed line arrow.

Note that in the case of laser irradiation through the first substrate 101 or the second substrate 102 (hereinafter also simply called a substrate), laser light with a wavelength which at least transmits the substrate is used for the laser light 133 and the laser light 135. Laser light with a wavelength in a visible light region or an infrared light region is preferably used. When the glass sheet 111 has a property of absorbing light transmitting the substrate, the glass sheet 111 can be irradiated with the laser light 133, which is used for irradiating the glass layer 113. A method by which the glass sheet 111 is made to have a light absorbing property will be described below in detail.

As laser light with a wavelength in a visible light region or an infrared light region, a gas laser such as an Ar laser, a Kr laser, or a $CO_2$ laser can be given, for example. In addition, a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, or a $Y_2O_3$ laser, can be given. Note that in the solid-state laser, the fundamental wave or the second harmonic is preferably used. Alternatively, a semiconductor laser such as a GaN laser, a GaAs laser, a GaAlAs laser, or an InGaAsP laser can be used. The semiconductor laser has an advantage in that oscillation output is stable, a frequency of maintenance is reduced, and operational costs are low.

In the case where the glass sheet 111 does not have a property of absorbing light which is transmitted through the substrate, the glass sheet 111 can be heated utilizing multiphoton absorption. Multiphoton absorption can be caused by using an ultra-short pulsed laser such as a picosecond laser, a femtosecond laser, or an attosecond laser. With the use of such a laser, even light has a long wavelength (low energy) and transmits the substrate, multiphoton absorption is caused in the glass sheet 111 or at the interface between the glass sheet 111 and a surface of the substrate and thus, the glass sheet 111 is heated and melted.

Further, with the use of light having high energy which does not transmit the substrate (e.g., wavelength in an ultraviolet region), the glass sheet 111 can be directly irradiated with the laser light 135 and heated.

As the laser light having a wavelength in an ultraviolet region, an excimer laser such as a XeCl laser or a KrF laser can be used, for example. In addition, a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, or a $Y_2O_3$ laser, can be given. Note that in the solid-state laser, the third harmonic or the fourth harmonic is preferably used.

An example of a heating method by which part of the glass sheet 111 is exposed and directly irradiated with the laser light 135 will be described below with reference to FIGS. 2A and 2B.

Figure 2A:
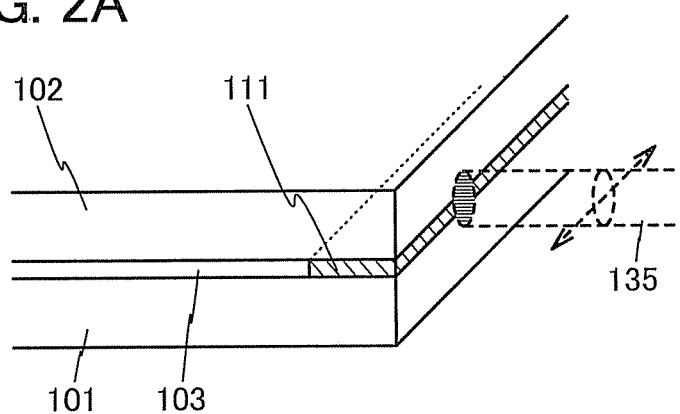
FIGS. 2A and 2B each show a method for manufacturing a sealed body of one embodiment of the present invention.
Figure 2B:
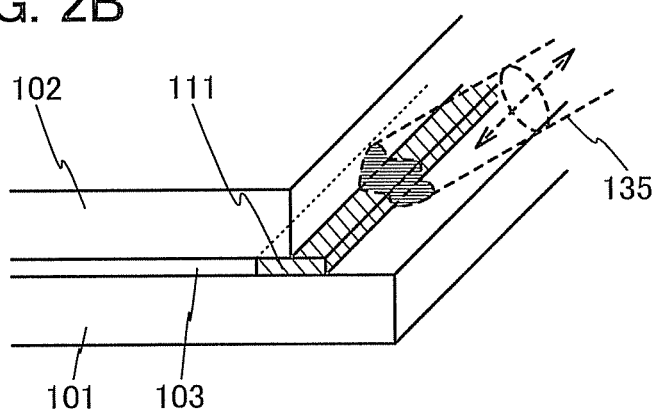

FIGS. 2A and 2B are each a schematic view showing a cross section along a cutting plane across the glass sheet 111 and side surfaces of the first substrate 101 and the second substrate 102.

FIG. 2A shows a method by which a side surface of the glass sheet 111 is substantially aligned with the side surfaces of the first substrate 101 and the second substrate 102 and exposed, and is irradiated with the laser light 135. According to such a method, part of the side surface of the glass sheet 111 and part of the side surfaces of the first substrate 101 and the second substrate 102 are melted and can be bonded to each other without fail. Here, the penetration depth of the laser light 135 in the width direction of the glass sheet 111 depends on the absorptance of the glass sheet 111 or the wavelength and strength of the laser light 135; therefore, an irradiation condition (e.g., strength and scanning speed) of the laser light 135 may be adjusted as appropriate so that the glass sheet 111 is entirely melted. Note that at this time, a region which is not melted remains in a region inside the glass sheet 111 in some cases.

FIG. 2B shows a method by which the second substrate 102 is shifted and provided so that part of a top surface of the glass sheet 111 is exposed, and the glass sheet 111 is irradiated with the laser light 135. Such a method is preferable because an area where the glass sheet 111 is irradiated with the laser light 135 can be increased, and thus, irradiation time can be shortened and scanning speed can be increased. Note that in FIG. 2B, the glass sheet 111 is obliquely irradiated with the laser light 135 from above; however, irradiation may be performed in a direction vertical to or horizontal to the first substrate 101 as long as the glass sheet 111 is directly irradiated. By oblique irradiation with the laser light 135 from above, part of the side surface and part of the top surface of the glass sheet 111 can be irradiated with laser light; thus, the glass sheet 111 can be heated efficiently, which is preferable.

Note that there is no limitation on the above method as long as part of the glass sheet 111 is exposed and directly irradiated with the laser light 135. For example, as shown in FIG. 1D, a structure may be employed in which the glass sheet 111 is provided inside the side surfaces of the first substrate 101 and the second substrate 102, and the glass sheet 111 is irradiated with the laser light 135 in a direction horizontal to the first substrate 101 and the second substrate 102. Further, the following structure may be employed: the glass sheet 111 is provided so that the side surface thereof is positioned outside the side surfaces of the first substrate 101 and the second substrate 102 and thus, part of the side surface, part of the top surface, and part of a bottom surface of the glass sheet 111 are exposed and irradiated with the laser light 135.

The above is the description of a method for directly irradiating the glass sheet 111 with the laser light 135.

As described above, a sealed body 100 including the sealed region 103 surrounded by the first substrate 101, the second substrate 102, the glass sheet 111, and the glass layer 113 can be manufactured. In the sealed body 100, the main portion is sealed with the glass sheet 111 whose top surface and bottom surface are flat, and a space between the adjacent glass sheets 111 is filled with the glass layer 113 formed of the glass frit; thus, the sealed body 100 has very high hermeticity. In addition, in the sealed body 100, the main portion is sealed with the glass sheet 111 with a uniform thickness, so that the distance (also referred to as a gap) between the first substrate 101 and the second substrate 102 can be uniform.

Note that although the step for applying the frit paste 123 after arranging the glass sheet 111 is described in the above, one embodiment of the present invention is not limited to this, and the glass sheet 111 may be arranged after the frit paste 123 is applied. At this time, a region where an end portion of the glass sheet 111 overlaps with the frit paste 123 is formed in some cases; however, the thickness of the frit paste 123 is decreased by removing the binder, resulting in reduction of an effect due to a step. Further, the thickness of the frit paste 123 in the region overlapping with the end portion of the glass sheet 111 is preferably decreased in advance.

The above is the description of an example of the manufacturing process of the glass pattern and the sealed body.

[Application Example]

In the sealed body 100 of one embodiment of the present invention, the glass layer 113 formed of the glass frit is used in part of a sealing portion. Here, even in the case where there is a step under the frit paste 123 before the binder is removed, the step can be sufficiently covered with the frit paste 123. Further, immediately after the binder is removed, part of the glass frit is welded and thus the glass layer 113 can be porous; therefore, even a step is formed on a surface of the second substrate 102 in contact with the glass layer 113 from above, the step can be covered with the glass frit melted by irradiation of the laser light 135 performed later. For this reason, even when a step is formed in regions of the first substrate 101 and the second substrate 102 overlapping with the sealing portion, the step can be effectively filled with the use of the glass layer 113; therefore, high hermeticity can be maintained.

Here, in the case where a unit or the like is encapsulated in the sealed region 103 of the sealed body 100, a wiring for inputting and outputting an electric signal to/from the unit or the like can be given as an example of the step formed in the regions overlapping with the sealing portion. Examples of the unit or the like provided in the sealed region 103 are a light-emitting unit including a light-emitting element (including an organic EL element and an inorganic EL element), such as an image display unit or lighting, a semiconductor circuit including a semiconductor element (including an organic semiconductor element), or an organic solar cell.

Figure 3:
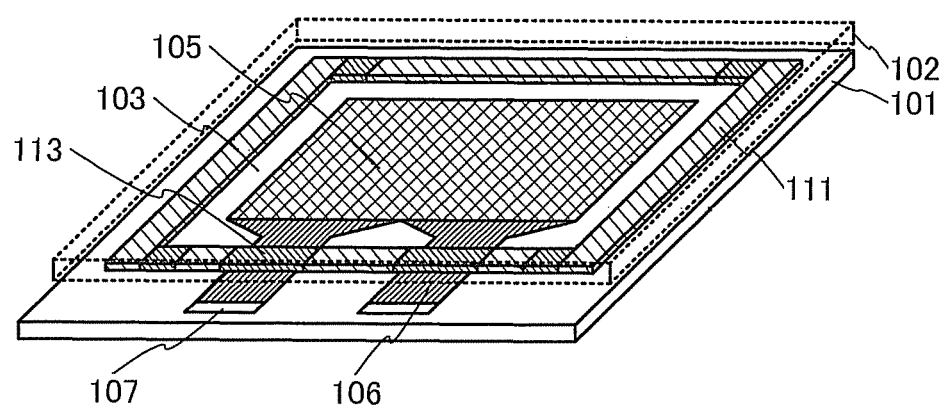
FIG. 3 shows a light-emitting device of one embodiment of the present invention.

As an example, FIG. 3 shows a schematic view of a light-emitting device in which an image display unit 105 is encapsulated in the sealed region 103 of the sealed body 100.

The image display unit 105 is arranged over the first substrate 101. A wiring 106 for inputting an electric signal to the image display unit 105 is provided to extend from the sealed region 103 to the outside of the sealed region 103. An end portion of the wiring 106 in the outside of the sealed region 103 is provided with an external connection terminal 107.

Here, as shown in FIG. 3, in a region overlapping with the wiring 106, a step caused by the thickness of the wiring 106 can be effectively covered by providing the glass layer 113, whereby high hermeticity of the sealed region 103 can be maintained. With the use of the glass sheet 111 in a region other than the region overlapping with the wiring 106, a gap between the first substrate 101 and the second substrate 102 can be uniform; therefore, reduction in the display quality of the image display unit 105 due to a non-uniform gap can be suppressed.

The above is the description of an application example of one embodiment of the present invention to a substrate including a step.

[Glass Sheet]

A glass sheet which can be used in a method for forming a glass pattern, which is one embodiment of the present invention, will be described below.

Figure 4A:
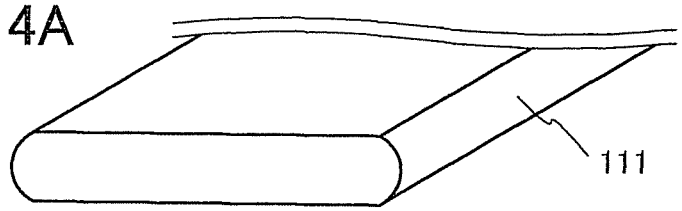
FIGS. 4A to 4F each show a glass sheet of one embodiment of the present invention.

FIG. 4A is a schematic view of a cross section of the glass sheet 111 which is cut in the width direction.

The glass sheet 111 is a strip-like glass material and whose top surface and bottom surface are substantially parallel to each other and substantially flat. The thickness of the glass sheet 111 is preferably greater than or equal to 3 μm and less than or equal to 100 μm, more preferably, greater than or equal to 5 μm and less than or equal to 20 μm. The width of the glass sheet 111 is preferably greater than or equal to 50 μm and less than or equal to 10 mm, more preferably greater than or equal to 200 μm and less than or equal to 3 mm.

The glass material which can be used for the glass sheet 111 preferably contains one or more compounds selected from the following group: magnesium oxide, calcium oxide, barium oxide, lithium oxide, sodium oxide, potassium oxide, boron oxide, vanadium oxide, zinc oxide, tellurium oxide, aluminum oxide, silicon oxide, lead oxide, tin oxide, phosphorus oxide, ruthenium oxide, rhodium oxide, iron oxide, copper oxide, titanium oxide, tungsten oxide, bismuth oxide, antimony oxide, and strontium oxide. Further, lead borate glass, tin phosphate glass, vanadate glass, borosilicate glass, or the like can be used.

For the glass sheet 111, it is preferable to use a material which has a close thermal expansion coefficient to one or both of the first substrate 101 and the second substrate 102 in temperature ranging from room temperature to softening temperature.

The side surface of the glass sheet 111 may be plane; however, as shown in FIG. 4A, the side surface of the glass sheet 111 is preferably curved and projected outside. With the use of a curved side surface which gradually connects with a top surface or a bottom surface and has no corner portion, cracking or chipping can be prevented when the glass sheet is used and resistance to external force such as bending and twisting can be increased; thus, a flexible glass sheet can be provided. A thermal stress generated in a heating step of the glass sheet 111 can be relieved on the side surface side (in the width direction); therefore, generation of cracks in the glass sheet 111 and the substrate in contact therewith can be suppressed.

Here, when the glass sheet 111 has a light absorbing property, irradiation of the laser light 135 can be performed easily as described above.

Figure 4B:
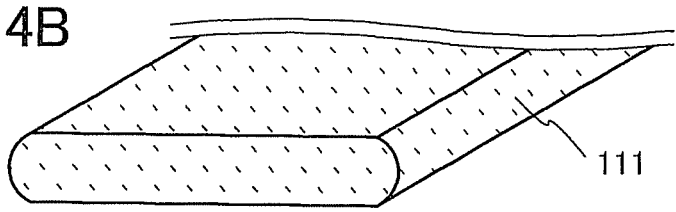

FIG. 4B shows the glass sheet 111 having a light absorbing property and including a material to which a light absorbing property is added.

As the material having a light absorbing property added to the glass sheet 111, an oxide of a transition metal, a rare earth metal, or the like can be used. The glass sheet 111 to which such a material is added can have a property of absorbing light with a wavelength in a visible light region or an infrared light region. The added material may be selected as appropriate depending on a wavelength of laser light to be used.

Further, the glass sheet 111 may have a light absorbing property by forming a light absorbing layer on a surface of the glass sheet 111.

Figure 4C:
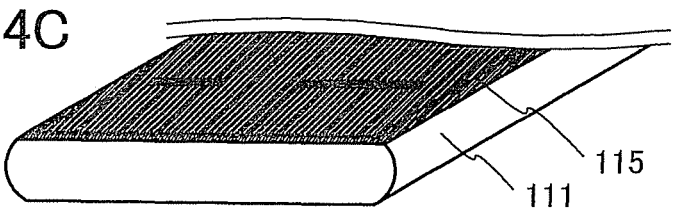

FIG. 4C shows a structure in which a light absorbing layer 115 is formed on a top surface (or a bottom surface) of the glass sheet 111.

For the light absorbing layer 115, a material which has a property of absorbing at least light with a wavelength of laser light to be used may be used. For example, an inorganic material such as a metal, a metal oxide, a semiconductor, or a semiconductor oxide, or an organic material containing carbon black, a pigment, or the like can be used. Note that the material to be used preferably has heat resistance to temperature higher than or equal to the softening temperature of the material used for the glass sheet 111.

As a method for forming the light absorbing layer 115, the following method or tool (equipment) can be used depending on the material: an evaporation method; a sputtering method; a coating method such as spin coating, dipping, or spray coating; a droplet discharge method (e.g., an inkjet method); a printing method such as screen printing or offset printing; a doctor knife; a roll coater; a curtain coater; a knife coater; or the like. Further, a roll-to-roll process is preferably employed in the formation of the light absorbing layer 115.

By providing the light absorbing layer 115 having a light absorbing property on only one surface of the glass sheet 111 in such a manner, the glass sheet 111 can have a light absorbing property very easily.

Figure 4D:
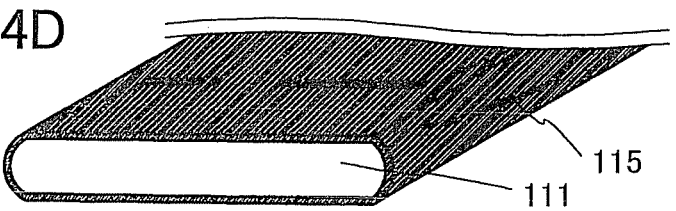

As shown in FIG. 4D, a structure in which the light absorbing layer. 115 covers at least the top surface and the bottom surface of the glass sheet 111 may be employed. With such a structure, the light absorbing property is increased and light of the laser light 135 can be further absorbed efficiently, and thus the scanning speed can be increased, resulting in an increase in the productivity.

Figure 4E:
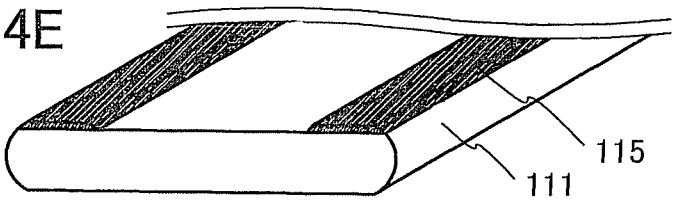

As shown in FIG. 4E, the light absorbing layer 115 may be provided so that at least part of the top surface (or the bottom surface) of the glass sheet 111 is exposed. By providing the light absorbing layer 115 in such a manner, the adhesion between the exposed portion and the substrate can be improved. At this time, when the light absorbing layer 115 is provided on a side portion of the top surface (or the bottom surface) of the glass sheet 111, the light absorbing layer does not remain at the interface with the substrate in a central portion; therefore, the adhesion can be improved. Although a light absorbing layer is provided on one surface in FIG. 4E, the light absorbing layer may be provided on both surfaces or side surfaces. Further, the light absorbing layer may be provided only on side surfaces.

Figure 4F:
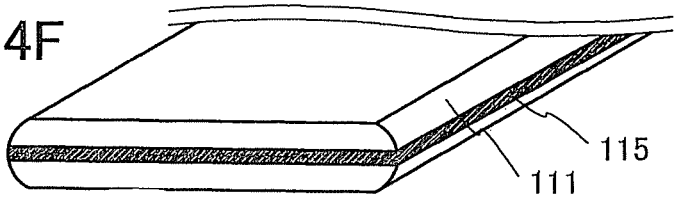

As shown in FIG. 4F, a structure may be employed in which the light absorbing layer 115 is sandwiched so that the top surface and the bottom surface of the glass sheet 111 are exposed. With such a structure, the glass sheet 111 can have a light absorbing property while the adhesion of the top surface and the bottom surface of the glass sheet 111 to the substrates is improved. Although the light absorbing layer 115 is provided so that a side surface thereof is exposed in FIG. 4F, the light absorbing layer 115 may be provided inside the glass sheet 111 so that the side surface thereof is not exposed. The light absorbing layer 115 may have a stripe shape, a dot shape, or a shape provided with an opening when seen from above. As described above, it is preferable to provide a region where the light absorbing layer 115 is not provided in the glass sheet 111, in which case the strength of the glass sheet 111 can be increased.

With the use of the above-described glass sheet 111, a gap between the substrates can be uniform and the sealed body having increased mechanical strength can be formed. By forming the glass sheet 111 having a light absorbing property as described above, the heating step can be simplified; therefore, productivity can be further improved.

Here, when an electrically conductive material is used for the light absorbing layer 115, a heating method using induction heating can be used in addition to a heating method using laser light. In the case of using induction heating, scanning needed in the case of using laser light is not needed and the glass sheet 111 can be entirely heated simultaneously in a short time; thus, the time of the step can be further shortened.

The above is the description of the glass sheet.

[Method for Arranging Glass Sheet]

A method for arranging the glass sheet 111 on one surface of the first substrate 101 will be described below.

When the glass sheet 111 is arranged on one surface of the first substrate 101, the glass sheet 111 is preferably fixed so that there is no misalignment of the position of the glass sheet 111.

As a method for fixing the glass sheet 111 to the first substrate 101, a method of bonding the glass sheet 111 with a bonding layer provided between the glass sheet 111 and the first substrate 101, a method of securing the glass sheet 111 by melting part of the glass sheet 111, a method of fixing the glass sheet 111 by using static electricity or surface junction, or the like can be used.

As the method of bonding the glass sheet 111 to the first substrate 101 with a bonding layer provided therebetween, a known material can be used for the bonding layer, and a material decomposed or volatilized at a temperature lower than or equal to a softening point of the glass sheet 111, preferably lower than or equal to 200° C. is preferably used. When the bonding layer remains at the interface between the substrate and the glass sheet 111 welded to the substrate after the irradiation of the laser light 135, the adhesive might be decreased and a crack might be generated. At the time of the irradiation of the laser light 135, in order to prevent the gasified bonding layer from being encapsulated in the sealed region 103, the bonding layer is preferably provided on part of the side surface or part of the bottom surface of the glass sheet 111, which are outside the sealed region 103. Alternatively, bonding layers may be provided separately in the length direction of the glass sheet 111 with a distance therebetween, or only an end portion in the length direction may be provided with the bonding layer.

In the case where the glass sheet 111 is secured to the first substrate 101 by melting part of the glass sheet 111, the glass sheet 111 or both of the glass sheet 111 and the first substrate 101 are heated and the glass sheet 111 are secured to the first substrate 101 by laser irradiation or pressing a heated member on the glass sheet 111 from above, for example. Alternatively, the glass sheet 111 may be secured separately in the length direction thereof with a distance therebetween or only an end portion in the length direction may be secured.

In the case where the glass sheet 111 is fixed to the first substrate 101 by using static electricity, one surface of the first substrate 101 preferably has high flatness. When bonding surfaces of the glass sheet 111 and the first substrate 101 are made flat, the adhesion is increased. In the case where the bonding surface of the first substrate 101 includes a material similar to that of the glass sheet 111, the first substrate 101 and the glass sheet 111 can be bonded to each other by their surface reaction, and the adhesion is increased, which is preferable. Alternatively, the first substrate 101 and the glass sheet 111 may be bonded to each other by ultrasonic bonding using ultrasonic vibration. Ultrasonic bonding is preferably used, in which case the first substrate 101 and the glass sheet 111 can be favorably bonded to each other even when the flatness of the bonding interface is relatively low.

Here, the glass sheet 111 is a strip-like thin film and thus can be wound on a reel and used. A method for arranging the glass sheet 111 with the use of a reel will be described below.

Figure 5A:
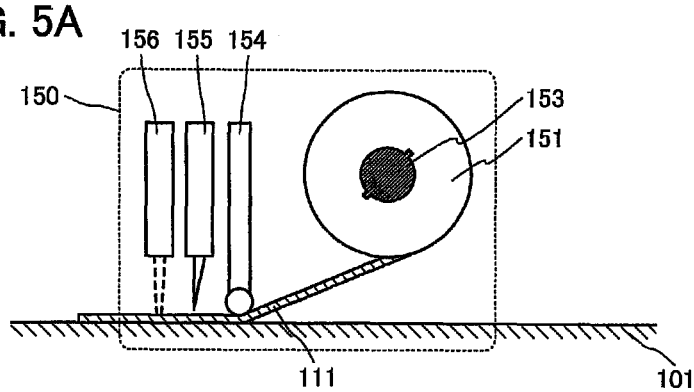
FIGS. 5A and 5B each show a method for forming a glass pattern of one embodiment of the present invention.

FIG. 5A is a schematic view of an apparatus 150 for arranging the glass sheet 111 on a surface to be bonded. With the apparatus 150, the glass sheet 111 wound on a reel is pulled out and fixed in a given position of one surface of the first substrate 101, and is cut in a given position. The glass sheet 111 can be arranged in a given position of the first substrate 101 by relatively moving the apparatus 150 and the first substrate 101.

The apparatus 150 includes a reel fixing unit 153, an adhesion unit 154, a cutting unit 155, and a fixing unit 156.

The reel fixing unit 153 fixes a reel 151 including the glass sheet 111 and has a mechanism to rotate the reel 151. The rotation speed of the reel fixing unit 153 can be controlled depending on the scanning speed of the apparatus 150.

The adhesion unit 154 attaches the glass sheet 111 pulled out of the reel 151 to a given position of the first substrate 101. Here, the adhesion unit 154 may physically press the glass sheet 111 using a tip with a roller or may attach the glass sheet 111 to the first substrate 101 by spraying a gas such as the air. The adhesion unit 154 may have a mechanism to support an end portion of the glass sheet 111 wound on the reel when not being used. For example, a tip of the adhesion unit 154 may be provided with an adsorption mechanism using vacuum adsorption.

The cutting unit 155 cuts the glass sheet 111 fixed to one surface of the first substrate 101, in a given position. Here, the cutting unit 155 may physically cut a glass sheet or may cut a glass sheet by using thermal strain caused by laser irradiation or the like. In the case of using laser light as the cutting unit 155, a glass sheet can be cut and an end portion thereof can be welded at the same time; therefore, the fixing unit 156 is not necessarily provided in the apparatus 150.

The fixing unit 156 is used when the glass sheet 111 is thermally secured. The fixing unit 156 may heat the glass sheet 111 by laser irradiation or may press the glass sheet 111 from above using a heated tip. Alternatively, the fixing unit 156 may have a mechanism for ultrasonic bonding using an ultrasonic vibrator.

Note that the adhesion unit 154 which has a tip including a heating mechanism or an ultrasonic vibrator can also be used as the fixing unit 156. In that case, the cutting unit 155 is preferably arranged in a position closer to the reel fixing unit 153 than to the adhesion unit 154. The fixing unit 156 is not necessarily provided in the case of fixing the glass sheet 111 by using static electricity or surface junction or in the case of using a bonding layer.

Further, the apparatus 150 may be provided with an alignment unit such as a camera to control a fixed position of the glass sheet 111, relative to an alignment marker provided on the first substrate 101.

Here, it is preferable to use the glass sheet 111 wound on a reel with at least one surface thereof is attached to a base. With the use of the base, parts of the glass sheet 111 do not in contact with each other when the apparatus 150 is used; thus, an unintended defect such as cracking or chipping caused by the contact can be suppressed.

Figure 5B:
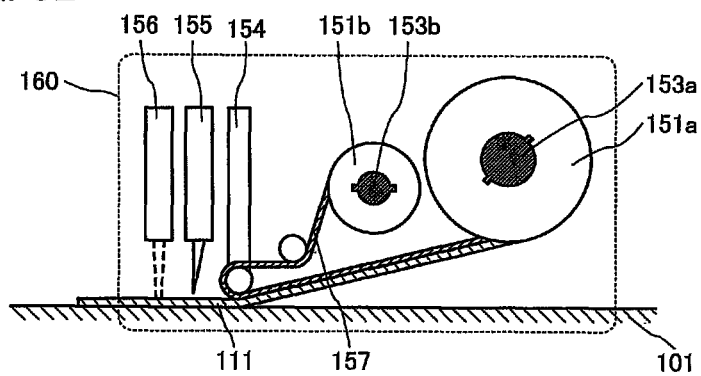

Here, an example of using the glass sheet 111 attached to a base in the apparatus 150 is shown in FIG. 5B.

An apparatus 160 shown in FIG. 5B is different from the apparatus 150 in that a reel fixing unit 153a fixing a reel 151a which includes the glass sheet 111 attached to a base 157 and a reel fixing unit 153b fixing the reel 151b which reels the base 157 are included. In addition, the adhesion unit 154 in the apparatus 160 has a structure different from that of the adhesion unit 154 in the apparatus 150.

The glass sheet 111 is pulled out of the reel 151a together with the base 157 and reached the adhesion unit 154. With the adhesion unit 154, the glass sheet 111 is attached to one surface of the first substrate 101 and the base 157 is separated from the glass sheet 111. The base 157 separated by the adhesion unit 154 is rolled up by the reel 151b fixed with the reel fixing unit 153b.

As described above, a given length of the glass sheet 111 can be fixed in a given position of one surface of the first substrate 101.

The above is the description of the method for fixing the glass sheet 111.

This embodiment can be combined with any of the other embodiments described in this specification as appropriate.

(Embodiment 2)

In this embodiment, an example of a light-emitting device including a sealed body of one embodiment of the present invention will be described with reference to drawings.

The sealed body of one embodiment of the present invention has very high hermeticity, and thus can be used in various devices including an element such as an organic EL element, an organic semiconductor element, or an organic solar cell, whose performance is rapidly decreased once the element is exposed to the air (including moisture or oxygen). In addition, the method for manufacturing a sealed body, which is one embodiment of the present invention, can be used for a device including an element with low heat resistance, and thus various devices can be manufactured with high productivity.

As a light-emitting device including an organic EL element, a display device, a lighting device, or the like can be given. As a display device including an organic EL element, a display device employing a passive matrix mode (i.e., simple matrix mode) or an active matrix mode can be given. A structural example of a display device employing an active matrix mode will be described below.

[Structural Example 1]

In this structural example, a top-emission display device including an organic EL element will be described.

FIG. 6A is a schematic top view of a display device 200 of one embodiment of the present invention. The display device 200 has a top-emission structure, which emits light to the side opposite to the substrate over which a light-emitting element is provided.

In the display device 200, a display portion 201, a scan line driver circuit 202, and a signal line driver circuit 203 are included in a sealed region surrounded by the first substrate 101, the second substrate 102, the glass sheet 111, and the glass layer 113. Further, the wiring 106 which is electrically connected to the scan line driver circuit 202 and the signal line driver circuit 203 extends from the inside to the outside of the sealed region, and the wiring is electrically connected to the external connection terminal 107. Through an FPC 207 which is electrically connected to the external connection terminal 107, a power source potential and a signal such as a driving signal for driving the scan line driver circuit 202, the signal line driver circuit 203, and the like can be input.

FIG. 6B is a schematic cross-sectional view along the line A-B and C-D of FIG. 6A, which passes through regions including the external connection terminal 107, the scan line driver circuit 202, and the display portion 201.

As a material of a substrate provided on the side from which light is emitted, a material having a light-transmitting property, such as glass or quartz, can be used. A substrate provided on the side opposite to the side from which light is emitted does not necessarily have a light-transmitting property, and a material such as a metal, a semiconductor, or ceramics can be used as well as the above materials. In the case where a conductive substrate is used, the substrate preferably has an insulating property by oxidation of its surface or formation of an insulating film over the surface. An organic resin can also be used as long as it is resistant to heat during the process. In the case where a material other than glass is used, an oxide film is preferably formed at least in a region in contact with the glass sheet and the glass layer so as to improve adhesion.

The substrate to be provided with a light-emitting element or a transistor is preferably heated in advance so as to be enough to shrink so that impurities such as water, hydrogen, or oxygen adsorbed on the substrate or its surface can be reduced. This heating reduces the diffusion of impurities in a process of manufacturing the light-emitting element or the transistor, leading to a highly reliable display device.

The external connection terminal 107 is formed using an electrically conductive layer included in transistors or a light-emitting element in the display device 200. In this structural example, the external connection terminal 107 includes a stack of a conductive layer used as gates of the transistors and an electrically conductive layer used as source electrodes and drain electrodes. The external connection terminal 107 preferably includes a stack of a plurality of electrically conductive layers because mechanical strength against a pressure bonding step performed on the FPC 207 can be increased. A connector 209 is provided in contact with the external connection terminal 107. The FPC 207 is electrically connected to the external connection terminal 107 through the connector 209. For the connector 209, it is possible to use a paste-form or sheet-form material which is obtained by mixing metal particles into a thermosetting resin and for which anisotropic electric conductivity is provided by thermocompression bonding. As the metal particles, particles in which two or more kinds of metals are layered, for example, Ni particles coated with Au are preferably used.

In FIG. 6B, the scan line driver circuit 202 includes a circuit in which n-channel transistors, transistors 211 and 212, are used in combination, as an example. Note that the scan line driver circuit 202 is not limited to this structure and may include various CMOS circuits in which an n-channel transistor and a p-channel transistor are used in combination or a circuit in which p-channel transistors are used in combination. Note that the same applies to the signal line driver circuit 203. Although a driver-integrated structure in which the scan line driver circuit 202 and the signal line driver circuit 203 are formed over the substrate provided with the display portion 201 is described in this structural example, the scan line driver circuit 202 or the signal line driver circuit 203, or both may be formed over a substrate different from the substrate provided with the display portion 201.

FIG. 6B shows a cross-sectional structure of one pixel as an example of the display portion 201. The pixel includes a switching transistor 213, a current control transistor 214, and a pixel electrode 223 that is electrically connected to an electrode (a source electrode or a drain electrode) of the current control transistor 214. In addition, an insulating layer 217 is formed to cover an end portion of the pixel electrode 223.

Note that there is no particular limitation on the structures of the transistors included in the display portion 201, the scan line driver circuit 202, and the signal line driver circuit 203. For example, a forward staggered transistor or an inverted staggered transistor may be used. Furthermore, a top-gate transistor or a bottom-gate transistor may be used. As a material of a semiconductor used for the transistors, for example, a semiconductor material such as silicon or germanium or an oxide semiconductor containing at least one of indium, gallium, and zinc may be used. Further, there is no particular limitation on the crystallinity of a semiconductor used for the transistors, and an amorphous semiconductor or a semiconductor having crystallinity (a microcrystalline semiconductor, a polycrystalline semiconductor, or a semiconductor partly including crystal regions) may be used. A semiconductor having crystallinity is preferably used, in which case deterioration of transistor characteristics can be reduced.

In FIG. 6B, a bottom-gate transistor is shown as an example of the structure of the transistor. Here, a semiconductor layer is provided in a region inside the gate electrode layer of the transistor when seen from above. With such a structure, when light enters from the first substrate 101 side, the gate electrode layer blocks the light, so that the semiconductor layer is not directly irradiated with the light; therefore, a change in electric characteristics of the transistor due to light irradiation can be suppressed.

Here, examples of structures different from that of the above transistor will be described with reference to FIGS. 7A to 7C. Here, examples of a bottom-gate transistor will be described.

Figure 7A:
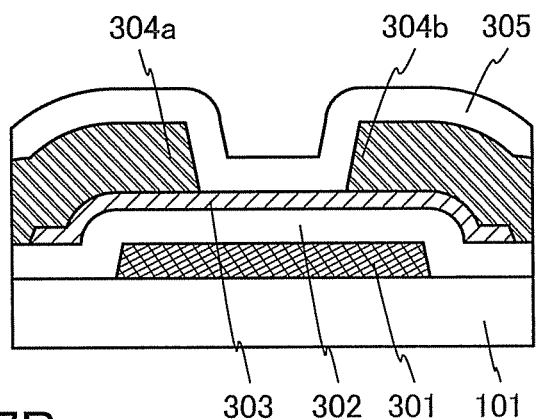
FIGS. 7A to 7C each show a structural example of a transistor of one embodiment of the present invention.

FIG. 7A is a schematic cross-sectional view of a bottom-gate transistor 300.

The transistor 300 includes a gate electrode layer 301, a gate insulating layer 302 covering the gate electrode layer 301, a semiconductor layer 303 overlapping with the gate electrode layer 301 with the gate insulating layer 302 provided therebetween, and a source electrode layer 304a and a drain electrode layer 304b each of which is electrically connected to the semiconductor layer 303. An insulating layer 305 is provided to cover the transistor 300.

Here, in the transistor 300, the source electrode layer 304a and the drain electrode layer 304b are formed to cover part of a top surface and side surface of the semiconductor layer 303. As shown in FIG. 7A, part of the top surface of the semiconductor layer 303 is etched and the thickness thereof is reduced in some cases when the source electrode layer 304a and the drain electrode layer 304b are processed by etching.

Note that the resistance of regions of the semiconductor layer 303, which are in contact with the source electrode layer 304a and the drain electrode layer 304b, may be reduced by adding an impurity or the like. When silicon is used as a semiconductor, a metal silicide may be formed. By reducing the resistance of the regions of the semiconductor layer 303, which are in contact with the source electrode layer 304a and the drain electrode layer 304b, contact resistances between the electrode layers and the semiconductor layer 303 can be reduced. The resistance of a portion between the source electrode layer 304a and the drain electrode layer 304b can be reduced; therefore, transistor characteristics such as on-state current can be improved, which is preferable.

The number of photomasks needed to form the transistor 300 having such a structure can be reduced; therefore, the manufacturing process can be simplified.

Figure 7B:
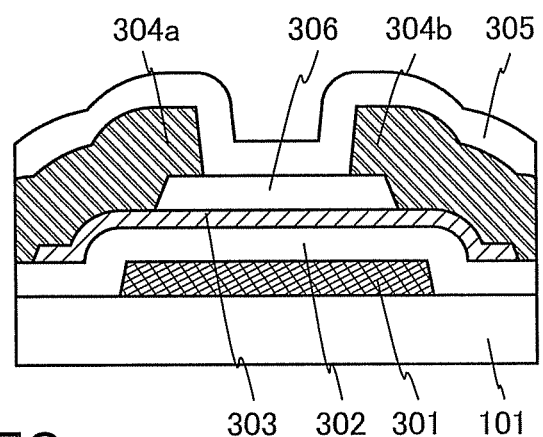

A transistor 310 shown in FIG. 7B is different from the transistor 300 shown in FIG. 7A in that an insulating layer 306 is formed over the semiconductor layer 303.

The insulating layer 306 is provided to protect the semiconductor layer 303 when the source electrode layer 304a and the drain electrode layer 304b are processed by etching. By providing the insulating layer 306, at least a top surface of a region of the semiconductor layer 303, where a channel is formed, is not exposed after the formation step of the insulating layer 306; therefore, the influence of contamination (metal contamination or organic contamination) caused in subsequent steps can be eliminated, resulting in a highly reliable transistor.

Figure 7C:
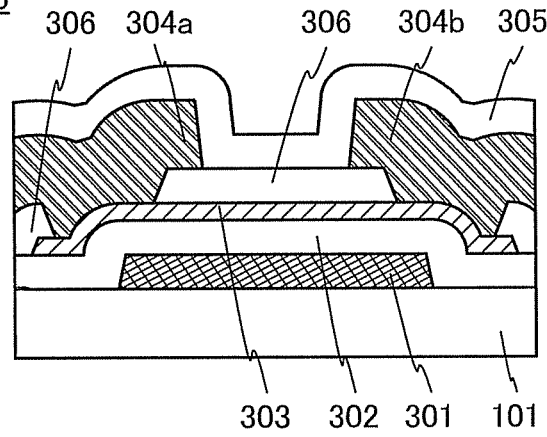

A transistor 320 shown in FIG. 7C is different from the transistor 310 shown in FIG. 7B in that the insulating layer 306 is formed over the semiconductor layer 303 in regions where openings for electrically connecting the source electrode layer 304a and the drain electrode layer 304b to the semiconductor layer 303 are not formed.

The source electrode layer 304a and the drain electrode layer 304b are each electrically connected to the semiconductor layer 303 through the openings provided in the insulating layer 306.

Here, as shown in FIG. 7C, end portions of the semiconductor layer 303 are covered with the insulating layer 306; thus, the regions where the openings are not formed are not exposed and the influence of contamination caused in subsequent steps can be effectively suppressed. Consequently, a highly reliable transistor can be provided.

The above is the description of the structural examples of the transistor.

A light-emitting element 220 shown in FIG. 6B includes the pixel electrode 223, an EL layer 225, and a common electrode 227. The structure, material, and the like of the light-emitting element will be described in detail in the following embodiment.

As electrically conductive materials used for the pixel electrode 223 and the common electrode 227, a material that transmits light emission from the EL layer 225 is used for an electrode to which light is emitted, and a material that reflects light emission from the EL layer 225 is used for an electrode provided on the side opposite to the electrode to which light is emitted.

In this structural example, a reflective material is used for the pixel electrode 223 and a light-transmitting material is used for the common electrode 227. Thus, light emission from the EL layer 225 is transmitted through the second substrate 102.

As the electrically conductive material having a light-transmitting property that can be used for the electrode to which light is emitted, an electrically conductive oxide such as indium oxide, indium tin oxide, indium zinc oxide, zinc oxide, zinc oxide to which gallium is added, graphene, or the like can be used. Other examples of the electrically conductive material are a metal material such as gold, silver, platinum, magnesium, nickel, tungsten, chromium, molybdenum, iron, cobalt, copper, palladium, and titanium; an alloy material containing any of these metal materials; and a nitride of any of these metal materials (e.g., titanium nitride). Note that when a metal material (or a nitride thereof) is used, its thickness is reduced so that light-transmitting property can be obtained. Alternatively, a stack of films of any of the above materials can be used as the electrically conductive layers. For example, a stack of films of a silver-magnesium alloy and indium tin oxide is preferably used to increase electric conductivity.

Note that the electrically conductive oxide used for the electrode through which light is emitted can be formed by a sputtering method. An electrically conductive oxide film can have an improved light-transmitting property when formed in an atmosphere containing argon and oxygen.

Further, in the case of the top-emission structure, the electrically conductive oxide film formed over the EL layer 225 is preferably a stack of a first electrically conductive oxide film formed under an atmosphere containing argon with reduced oxygen concentration and a second electrically conductive oxide film formed under an atmosphere containing argon and oxygen, in which case damage to the EL layer 225 during the formation of the electrically conductive oxide film can be reduced. In this case; in the formation of the first electrically conductive oxide film, it is preferable to use an argon gas with purity, for example, an argon gas whose dew point is lower than or equal to −70° C., more preferably lower than or equal to −100° C.

As an electrically conductive material having a light-reflecting property that can be used for the electrode provided on the side opposite to the electrode to which light is emitted, any of the following materials can be used: a metal material such as aluminum, gold, platinum, silver, nickel, tungsten, chromium, molybdenum, iron, cobalt, copper, and palladium; or an alloy material containing any of these metal materials. Alternatively, lanthanum, neodymium, germanium, or the like may be added to any of the above the metal materials or the alloy materials. Any of the following can also be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, by stacking a metal film or a metal oxide film in contact with a film containing aluminum, oxidation of the film containing aluminum can be suppressed. Examples of a metal material or a metal oxide material for a film in contact with the film containing aluminum are titanium, titanium oxide, and the like. Alternatively, a stack of a film containing any of the above light-transmitting materials and a film containing any of the above metal materials may be used. For example, a layered film of silver and indium tin oxide, or a layered film of a silver-magnesium alloy and indium tin oxide can be used.

The insulating layer 217 is provided to cover the end portion of the pixel electrode 223. Moreover, an upper end portion or a lower end portion of the insulating layer 217 preferably has a curved surface, with a radius of curvature of 0.2 μm to 3 μm in order to be adequately covered with the common electrode 227 which is formed over the insulating layer 217. As a material of the insulating layer 217, an organic compound such as a negative photosensitive resin or a positive photosensitive resin, or an inorganic compound such as silicon oxide or silicon oxynitride can be used.

An insulating layer 235 functions as a planarization layer for suppressing the influence of an uneven shape due to the transistors provided below the light-emitting element 220. With the insulating layer 235, defects such as a short circuit between the electrodes of the light-emitting element 220 can be suppressed. The insulating layer 235 can be formed using an organic compound such as an organic resin.

An insulating layer 215 is formed over a surface of the first substrate 101. The insulating layer 215 reduces diffusion of impurities included in the first substrate 101. The insulating layers 216 and 218, which are in contact with a semiconductor layer in the transistors, and the insulating layer 219, which covers the transistors, preferably reduce diffusion of impurities into the semiconductor included in the transistors. For these insulating layers, for example, a semiconductor such as silicon, an oxide or a nitride of a metal such as aluminum can be used. Alternatively, a stack of such an inorganic insulating material or a stack of such an inorganic insulating material and an organic insulating material may be used. Note that the insulating layer 215 is not necessarily provided when not needed.

The second substrate 102 is provided with a color filter 229 so that the color filter 229 overlaps with the light-emitting element 220. The color filter 229 is provided in order to adjust the color of light emitted from the light-emitting element 220. For example, in a full-color display device using white light-emitting elements, a plurality of pixels provided with color filters of different colors are used. In that case, the color filters may be those of three colors of R (red), G (green), and B (blue) or four colors (yellow (Y) in addition to these three colors). Further, a white (W) pixel may be added to R, $_G$ and B pixels (and a Y pixel). That is, color filters of four colors (or five colors) may be used.

Further, a black matrix 231 is provided between adjacent color filters 229. The black matrix 231 blocks a pixel from light emitted from the light-emitting element 220 in an adjacent pixel, thereby preventing color mixture between the adjacent pixels. The color filter 229 is provided so that its end portion overlaps with the black matrix 231, whereby light leakage can be reduced. The black matrix 231 can be formed using a material that blocks light emitted from the light-emitting element 220, for example, a metal or an organic resin including a pigment. Note that the black matrix 231 may be provided in a region other than the display portion 201, for example, in the scan line driver circuit 202.

In addition, an overcoat 233 is formed to cover the color filter 229 and the black matrix 231. The overcoat 233 protects the color filter 229 and the black matrix 231 and suppresses the diffusion of impurities included in the color filter 229 and the black matrix 231. For the overcoat 233, a material that transmits light emitted from the light-emitting element 220 is used, and an inorganic insulating film or an organic insulating film can be used. Note that the overcoat 233 is not necessarily provided.

Although only one light-emitting element 220 is shown in the cross-sectional view in FIG. 6B, light-emitting elements that emit light of three colors (R, G, and B) can be selectively formed in the pixel portion 201 to form a display device capable of full color display. Alternatively, a light-emitting element including a white light-emitting EL layer described in the following embodiment and a color filter can be combined to form a display device capable of full color display. The light-emitting element is not limited to having a top-emission structure, and can have any of a bottom-emission structure and a dual-emission structure. A structural example of a display device having a bottom-emission structure will be described in Structural example 2.

The first substrate 101 and the second substrate 102 are bonded to each other with the glass sheet 111 and the glass layer 113 at the periphery of the second substrate 102. The glass sheet 111 and the glass layer 113 can have any of the structures described in the above embodiment.

In FIG. 6B, the glass layer 113 is provided over the wiring 106, and the glass sheet 111 is provided in a region where the wiring 106 is not provided. In such a manner, the glass layer 113 is used in a region where the wiring 106 and the like are provided and a step is formed, so that projection and depression in the region can be covered effectively, resulting in an increase in hermeticity. In addition, it is preferable that a region where the glass sheet 111 is provided do not include a step.

As described above, the glass sheet 111 is provided in a region where the distance between surfaces of the first substrate 101 and the second substrate 102 facing each other is uniform, and the glass layer 113 with high coverage is provided in a region where the distance varies; thus, a constant distance can be maintained between the substrates. In particular, in the top-emission display device in which the color filter 229 is provided on the second substrate 102 facing the first substrate 101 provided with the light-emitting element 220, color mixture between adjacent pixels becomes a problem when the distance between the light-emitting element 220 and the color filter 229 is large. For this reason, it is important to control the distance of a gap accurately and uniformly. In the display device of one embodiment of the present invention, the distance between the substrates can be controlled easily and accurately depending on the thickness of the glass sheet 111; thus, the display device can have improved display quality.

The light-emitting element 220 is provided in the sealed region 103 surrounded by the first substrate 101, the second substrate 102, the glass sheet 111, and the glass layer 113. The sealed region 103 may be filled with an inert gas such as a rare gas or a nitrogen gas, a solid such as organic resin, or a viscous material such as a gel, or may contain a reduced pressure atmosphere. Impurities such as water or oxygen are preferably reduced in the sealed region 103 so that the reliability of the light-emitting element 220 is increased.

Moreover, an insulating film covering the light-emitting element 220 prevents exposure of the light-emitting element 220, which increases reliability. As the insulating film, a material which does not transmit impurities such as moisture or oxygen is used. For example, a single layer or a layered structure of an inorganic insulating film such as a film of an oxide or a nitride of silicon or aluminum can be used.

Further, a drying agent may be provided in a region which is not overlapped with the light-emitting element 220 in the sealed region 103. As the drying agent, for example, a substance which adsorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the drying agent. The drying agent is preferably provided in the sealed region 103, in which case impurities such as moisture can be reduced and the reliability of the light-emitting element 220 can be increased.

The above is the description of the top-emission display device 200 including the light-emitting element.

[Structural Example 2]

In this structural example, a bottom-emission display device will be described. Note that description of the portions described in Structural example 1 is omitted or is simply given.

Figure 8:
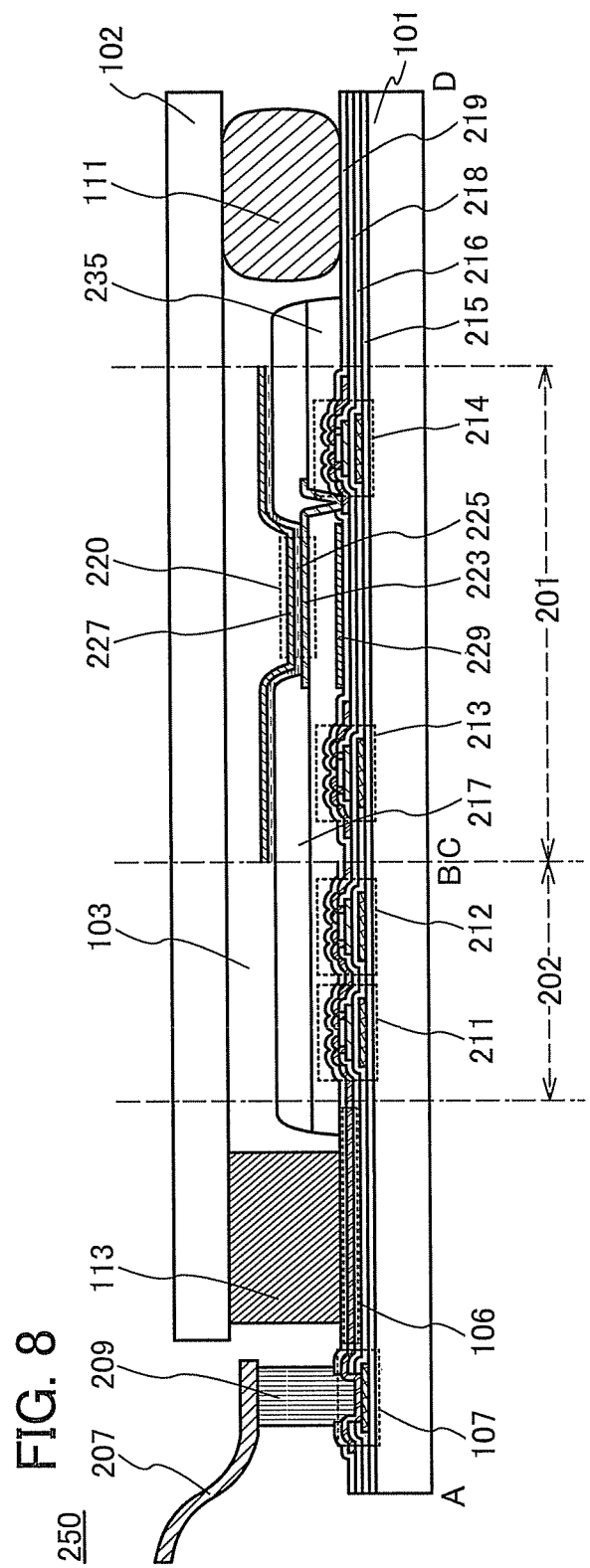
FIG. 8 shows a light-emitting device of one embodiment of the present invention.

FIG. 8 is a schematic cross-sectional view of a display device 250 described as an example in this structural example.

The display device 250 is different from the display device 200 described in Structural example 1 in that the display device 250 has a bottom-emission structure and, in the display device 250, a color filter 229 is provided closer to the first substrate 101 than the light-emitting element 220 is.

In the light-emitting element 220, the reflective material is used for the common electrode 227 and the light-transmitting material is used for the pixel electrode 223. Thus, light emission from the EL layer 225 is emitted to the first substrate 101.

Further, the color filter 229 is provided over the insulating layer 219 covering transistors to overlap with the light-emitting element 220. The insulating layer 235 is provided to cover the color filter 229.

The above is the description of the bottom-emission display device 250 including the light-emitting element.

The sealed body and the method for manufacturing the sealed body, which are one embodiment of the present invention, can be used for the display device described as an example in this embodiment; therefore, the display device having extremely high reliability can be provided with high productivity.

This embodiment can be combined with any of the other embodiments described in this specification as appropriate.

(Embodiment 3)

In this embodiment, as another example of the light-emitting device including a sealed body of one embodiment of the present invention, an example of a lighting device including an organic EL element will be described with reference to drawings. Note that description of the same portions as the above embodiments is omitted or is simplified.

Figure 9A:
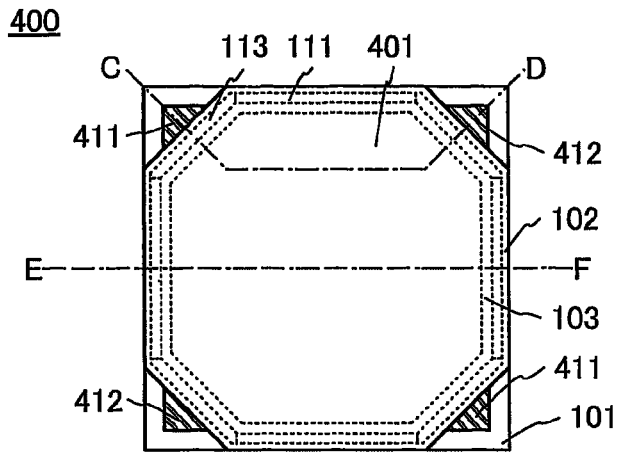
FIGS. 9A to 9C show a light-emitting device of one embodiment of the present invention.

FIG. 9A is a schematic top view of a lighting device 400 described as an example in this embodiment.

In the lighting device 400, a light-emitting portion 401 is included in the sealed region 103 surrounded by the first substrate 101, the second substrate 102, the glass sheet 111, and the glass layer 113. In addition, an extraction electrode 411 and an extraction electrode 412 which are electrically connected to the light-emitting portion 401 and supply electric power which causes the light-emitting portion 401 to emit light are provided to extend from the sealed region 103.

Figure 9B:
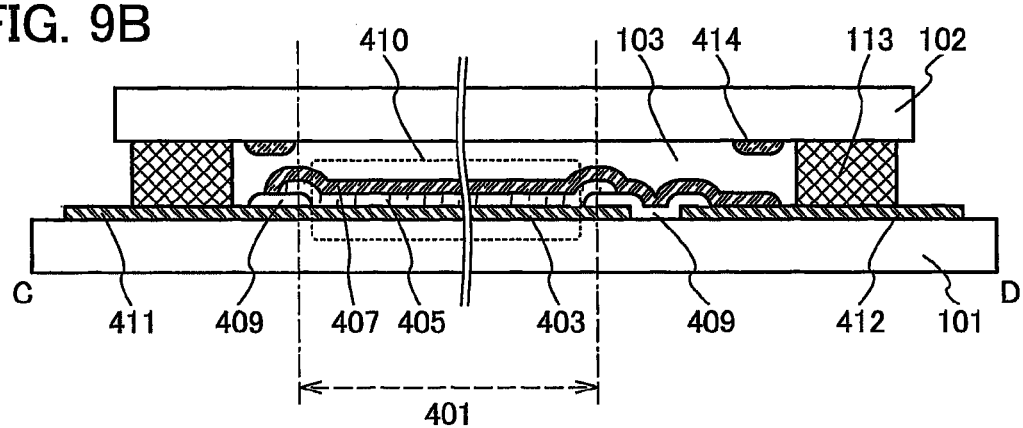
Figure 9C:
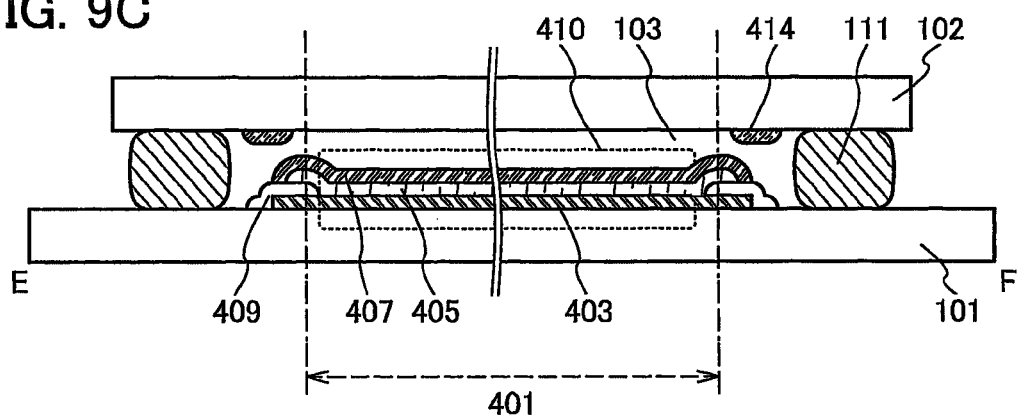

FIG. 9B is a schematic cross-sectional view along the line C-D, which cuts a region including the light-emitting portion 401 and the extraction electrodes 411 and 412 in FIG. 9A. FIG. 9C is a schematic cross-sectional view along the line E-F, which cuts a region where the extraction electrodes 411 and 412 are not provided.

In the sealed region 103, a light-emitting element 410 including an electrode 403, an EL layer 405, and an electrode 407 is provided over the first substrate 101.

The electrode 403 is electrically connected to the extraction electrode 411. Further, the electrode 407 is electrically connected to the extraction electrode 412. Here, FIG. 9B shows an example in which the electrode 403 and the extraction electrodes 411 and 412 are formed using the same layer on the same plane and part of the electrode 403, which is extracted to the outside of the sealed region 103, forms the extraction electrode 411.

The electrode 407 is formed so as to extend beyond the insulating layer 409 which covers each of end portions of the electrode 403 and the extraction electrode 412, and electrically connected to the extraction electrode 412.

Here, the lighting device 400 can have any of a bottom emission structure, a top emission structure, and a dual emission structure. An electrically conductive material used for the electrodes 403 and 407 or a material used for the first substrate 101 and the second substrate 102 can be appropriately selected from the above materials depending on an employed emission structure.

Here, the first substrate 101 and the second substrate 102 are bonded to each other at the periphery of the second substrate 102 with the glass sheet 111 and the glass layer 113. The glass layer 113 is provided in a region overlapping with the extraction electrode 411 or the extraction electrode 412, and a step therein are effectively covered. On the other hand, the glass sheet 111 is provided in a region where the extraction electrodes 411 and 412 are not provided. The distance between the first substrate 101 and the second substrate 102 can be controlled depending on the thickness of the glass sheet 111; therefore, the thickness of the lighting device 400 can be reduced with the use of the thin glass sheet 111.

Further, in order to support the electric conductivity of the electrode 403 or the electrode 407, an auxiliary electrode formed of a low-resistance electrically conductive material may be provided so as to be electrically connected to one or both of the electrode 403 and the electrode 407. In particular, in the case of the lighting device 400 having a large area, a potential drop due to the resistance of the electrode may cause distribution of emission luminance; therefore, it is effective to provide the auxiliary electrode.

For example, the auxiliary electrode is provided in contact with a top surface or a bottom surface of the electrode 403 or the electrode 407. Alternatively, the auxiliary electrode which is electrically connected to the electrode 407 through an insulating layer is provided over the electrode 403. In the case where the auxiliary electrode which is in contact with the electrode 403 is provided, a step due to the auxiliary electrode is preferably covered with the insulating layer 409 and smoothed.

Further, as shown in FIGS. 9B and 9C, a dry agent 414 is preferably provided in the sealed region 103. In the case of the top-emission structure or the dual-emission structure, the dry agent 414 is provided in a region which is not overlapped with the light-emitting element 410.

In addition, an insulating layer which suppresses diffusion of impurities from the substrate may be formed on a surface of the light-emitting element 410 side of one of or both the first substrate 101 and the second substrate 102.

Note that an inorganic insulating film which covers the light-emitting element 410 and does not transmit impurities such as water or oxygen may be provided. Moreover, the sealed region 103 may be filled with an inert gas, a solid, or a viscous material, or may contain a reduced pressure atmosphere.

The sealed body and the method for manufacturing the sealed body, which are one embodiment of the present invention, can be used for the display device described as an example in this embodiment; therefore, the display device having extremely high reliability can be provided with high productivity.

This embodiment can be combined with any of he other embodiments disclosed in this specification as appropriate.

(Embodiment 4)

In this embodiment, an example of the EL layer that can be applied to one embodiment of the present invention will be described with reference to FIGS. 10A to 10C.

Figure 10A:
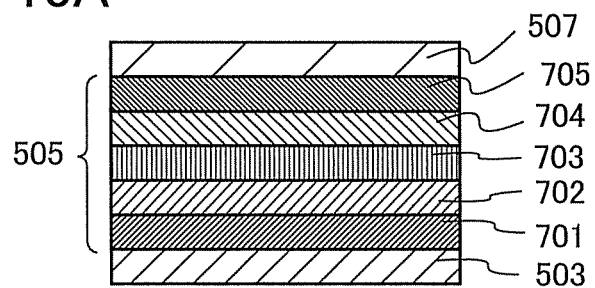
FIGS. 10A to 10C each show an EL layer of one embodiment of the present invention.

An EL layer 505 shown in FIG. 10A is provided between a first electrode 503 and a second electrode 507. The first electrode 503 and the second electrode 507 can be have a structure similar to that of the pixel electrode or the common electrode described as an example in Embodiment 2, or the electrode described as an example in Embodiment 3.

A light-emitting element including the EL layer 505, which is described as an example in this embodiment, can be applied to any of the light-emitting devices described as examples in the above embodiments.

The EL layer 505 needs to include at least a light-emitting layer including a light-emitting organic compound. The EL layer 505 may have a stacked layer structure of a layer including a substance having a high electron-transport property, a layer including a substance having a high hole-transport property, a layer including a substance having a high electron-injection property, a layer including a substance having a high hole-injection property, a layer including a bipolar substance (a substance having a high electron-transport property and a high hole-transport property), and the like in appropriate combination. In the EL layer 505 of this embodiment, a hole-injection layer 701, a hole-transport layer 702, a layer 703 including a light-emitting organic compound, an electron-transport layer 704, and an electron-injection layer 705 are stacked in this order over the first electrode 503. Note that the stacking order of these layers may be reversed.

A method for manufacturing the light-emitting element shown in FIG. 10A will be described.

The hole-injection layer 701 is a layer including a substance having a high hole-injection property. As the substance having a high hole-injection property, for example, any of the following metal oxides can be used: molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide. A phthalocyanine-based compound such as phthalocyanine (abbreviation: $H_2Pc$), or copper(II) phthalocyanine (abbreviation: CuPc) can also be used.

Alternatively, an aromatic amine compound which is a low molecular organic compound or the like can be used.

Further alternatively, a high molecular compound (e.g., an oligomer, a dendrimer, or a polymer) can be used. A high molecular compound to which acid is added can also be used.

In particular, the hole-injection layer 701 is preferably formed with a composite material in which an acceptor substance is mixed with an organic compound having a high hole-transport property. The use of the composite material, in which an acceptor substance is mixed with a substance having a high hole-transport property, allows efficient hole injection from the first electrode 503, and reduction in driving voltage of the light-emitting element. Such a composite material can be formed by co-evaporation of a substance having a high hole-transport property and an acceptor substance (an electron acceptor). By using the composite material for the hole-injection layer 701, holes can be easily injected from the first electrode 503 to the EL layer 505.

As the organic compound used for the composite material, any of a variety of compounds such as aromatic amine compounds, carbazole derivatives, aromatic hydrocarbons, and high molecular compounds (such as oligomers, dendrimers, and polymers) can be used. The organic compound used for the composite material is preferably an organic compound having a high hole-transport property. Specifically, a substance having a hole mobility of $10^{-6}$ cm$^2$/Vs or higher is preferably used. Note that any other substances may also be used as long as its hole-transport property is higher than its electron-transport property.

As the organic compound that can be used for the composite material, an aromatic amine compound, a carbazole derivative, an aromatic hydrocarbon compound having a high hole mobility can be used.

Examples of the acceptor substance are organic compounds and transition metal oxides. Any of oxides of metals belonging to Groups 4 to 8 in the periodic table can also be used. Specifically, it is preferable to use vanadium oxide, niobium oxide, tantalum oxide, chromium oxide, molybdenum oxide, tungsten oxide, manganese oxide, or rhenium oxide because of their high electron-accepting property. Among these metal oxides, molybdenum oxide is especially preferable because it is stable in the air, has a low hygroscopic property, and is easily treated.

A composite material may be formed using a high molecular compound and the aforementioned electron acceptor and used for the hole-injection layer 701.

The hole-transport layer 702 is a layer including a substance having a high hole-transport property. As the substance having a high hole-transport property, for example, any of aromatic amine compounds can be used. These substances are mainly ones that have a hole mobility of $10^{-6}$ cm$^2$V·.s or higher. Note that any other substances may also be used as long as its hole-transport property is higher than its electron-transport property. The layer including a substance having a high hole-transport property is not limited to a single layer, and two or more layers containing the aforementioned substances may be stacked.

A carbazole derivative, an anthracene derivative, or a high molecular compound having a high hole-transport property may also be used for the hole-transport layer 702.

For the layer 703 including a light-emitting organic compound, a fluorescent compound which exhibits fluorescence or a phosphorescent compound which exhibits phosphorescence can be used.

Note that the layer 703 including a light-emitting organic compound may have a structure in which a light-emitting organic compound (guest material) is dispersed in another substance (host material). Various kinds of materials can be used as the host material, and it is preferable to use a substance which has a lowest unoccupied molecular orbital level (LUMO level) higher than that of the light-emitting substance and has a highest occupied molecular orbital level (HOMO level) lower than that of the light-emitting substance.

Alternatively, two or more kinds of materials can be used as the host material. For example, a substance preventing crystallization may be added in order to prevent crystallization. A different kind of substance may be further added in order to efficiently transfer energy to the guest material. In addition, another substance may be added in order to efficiently transfer energy to the guest material.

With a structure in which a guest material is dispersed in a host material, crystallization of the layer 703 including a light-emitting organic compound can be suppressed. Further, concentration quenching due to high concentration of the guest material can be suppressed.

For the layer 703 including a light-emitting organic compound, a high molecular compound can be used.

Further, when a plurality of layers each including a light-emitting organic compound is provided and the emission colors of the layers are made different, light emission of a desired color can be obtained from the light-emitting element as a whole. For example, in a light-emitting element including two layers each including a light-emitting organic compound, the emission color of a first layer including a light-emitting organic compound and the emission color of a second layer including a light-emitting organic compound are made complementary, so that the light-emitting element as a whole can emit white light. Note that "complementary colors" refer to colors that can produce an achromatic color when mixed. In other words, by mixing light obtained from substances which emit light of complementary colors, white light emission can be obtained. This can be applied to a light-emitting element including three or more layers each including a light-emitting organic compound.

The electron-transport layer 704 is a layer including a substance having a high electron-transport property. Examples of the substance having a high electron-transport property are mainly ones that have an electron mobility of $10^{-6}$ cm$^2$/Vs or higher. Furthermore, the electron-transport layer is not limited to a single layer and may be a stack of two or more layers including any of the above substances.

The electron-injection layer 705 is a layer including a substance having a high electron-injection property. For the electron-injection layer 705, an alkali metal, an alkaline-earth metal, or a compound thereof, such as lithium, cesium, calcium, lithium fluoride, cesium fluoride, calcium fluoride, or lithium oxide, can be used. A rare-earth metal compound such as erbium fluoride can also be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an inkjet method, or a coating method.

Figure 10B:
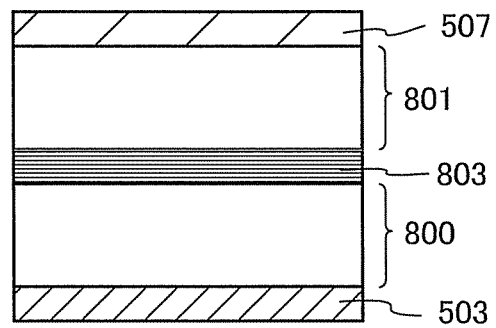

As shown in FIG. 10B, a plurality of EL layers may be stacked between the first electrode 503 and the second electrode 507. In that case, a charge generation layer 803 is preferably provided between a first EL layer 800 and a second EL layer 801 which are stacked. The charge generation layer 803 can be formed using the above-described composite material. Further, the charge generation layer 803 may have a stacked-layer structure-including a layer including the composite material and a layer including another material. In that case, as the layer including another material, a layer including a substance having an electron-donating property (a donor substance) and a substance having a high electron-transport property, a layer formed of a transparent conductive film, or the like can be used. A light-emitting element having such a structure is unlikely to suffer the problem of energy transfer, quenching, or the like and gives wider choice of materials, thereby easily having both high light emission efficiency and a long lifetime. In addition, a light-emitting element which provides phosphorescence from one EL layer and fluorescence from another EL layer can be easily obtained. This structure can be combined with any of the above-mentioned EL layer structures.

Furthermore, different emission colors of the EL layers enable light emission of a desired color to be obtained from the light-emitting element as a whole. For example, the emission colors of first and second EL layers are complementary in a light-emitting element having the two EL layers, so that the light-emitting element can be made to emit white light as a whole. This can be applied to a light-emitting element having three or more EL layers.

In order to obtain white light with a high color rendering property, an emission spectrum needs to cover the whole visible light range and thus a light-emitting element preferably includes three or more EL layers stacked. For example, such a light-emitting element can be formed by stacking EL layers emitting light of the respective colors of red, blue, and green. In this manner, the color rendering property of a light-emitting element can be improved by stacking EL layers of different three or more colors.

An optical adjustment layer may be formed between the first electrode 503 and the second electrode 507. The optical adjustment layer adjusts the optical distance between a reflective electrode and a light-transmitting electrode. With the optical adjustment layer, light with wavelengths in a specific range can be enhanced so that the color tone can be adjusted.

Figure 10C:
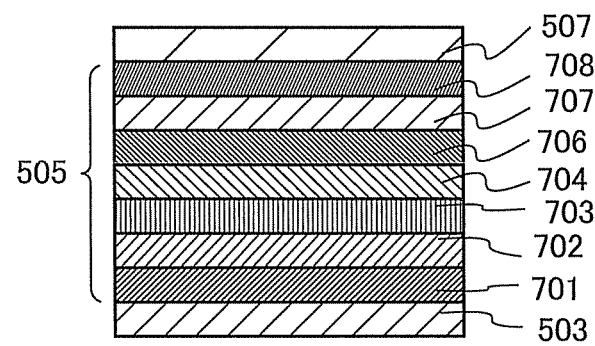

As shown in FIG. 10C, the EL layer 505 may include, between the first electrode 503 and the second electrode 507, the hole-injection layer 701, the hole-transport layer 702, the layer 703 including a light-emitting organic compound, the electron-transport layer 704, an electron-injection buffer layer 706, an electron-relay layer 707, and a composite material layer 708 that is in contact with the second electrode 507.

The composite material layer 708 which is in contact with the second electrode 507 is preferably provided, in which case damage caused to the EL layer 505 particularly when the second electrode 507 is formed by a sputtering method can be reduced. The composite material layer 708 can be formed using the above-described composite material in which an acceptor substance is mixed with an organic compound having a high hole-transport property.

With the electron-injection buffer layer 706, an injection barrier between the composite material layer 708 and the electron-transport layer 704 can be reduced, and accordingly electrons generated in the composite material layer 708 can be easily injected into the electron-transport layer 704.

For the electron-injection buffer layer 706, any of the following substances having a high electron-injection property is used: alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)).

In addition, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can also be used other than any of alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)). Note that as the substance having a high electron-transport property, a material similar to the material for the electron-transport layer 704 described above can be used.

The electron-relay layer 707 is preferably formed between the electron-injection buffer layer 706 and the composite material layer 708. The electron-relay layer 707 is not necessarily provided; however, with the electron-relay layer 707 having a high electron-transport property, electrons can be rapidly transported to the electron-injection buffer layer 706.

The structure in which the electron-relay layer 707 is provided between the composite material layer 708 and the electron-injection buffer layer 706 is a structure in which the acceptor substance included in the composite material layer 708 and the donor substance included in the electron-injection buffer layer 706 are less likely to interact with each other, and thus their functions hardly interfere with each other. Accordingly, an increase in the driving voltage can be prevented.

The electron-relay layer 707 contains a substance having a high electron-transport property and is formed so that the LUMO level of the substance having a high electron-transport property is located between the LUMO level of the acceptor substance included in the composite material layer 708 and the LUMO level of the substance having a high electron-transport property which is included in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property which is included in the electron-transport layer 704. As a specific value of the energy level, the LUMO level of the substance having a high electron-transport property which is included in the electron-relay layer 707 is preferably greater than or equal to −5.0 eV, more preferably greater than or equal to −5.0 eV and less than or equal to −3.0 eV.

As the substance having a high electron-transport property which is included in the electron-relay layer 707, a phthalocyanine-based material or a metal complex having a metal-oxygen bond and an aromatic ligand is preferably used.

As the metal complex having a metal-oxygen bond and an aromatic ligand, which is included in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is considered stable. Thus, the use of the metal complex having the metal-oxygen double bond makes it possible to drive a light-emitting element at low voltage more stably.

As a metal complex having a metal-oxygen bond and an aromatic ligand, a phthalocyanine-based material is preferable. A substance in which a metal-oxygen double bond is more likely to act on another molecular in terms of a molecular structure is particularly preferable because it has a high acceptor property.

Note that as the phthalocyanine-based materials described above, a phthalocyanine-based material having a phenoxy group is preferred. Specifically, a phthalocyanine derivative having a phenoxy group, such as PhO-VOPc, is preferred. A phthalocyanine derivative having a phenoxy group is soluble in a solvent. For that reason, such a phthalocyanine derivative has an advantage of being easily handled during formation of a light-emitting element. Further, owing to the solubility in a solvent, such a phthalocyanine derivative also has an advantage of facilitating maintenance of an apparatus used for forming a film.

The electron-relay layer 707 may further contain a donor substance. As the donor substance, an organic compound such as tetrathianaphthacene (abbreviation: TTN), nickelocene, or decamethylnickelocene can be used other than any of alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)). When such a donor substance is included in the electron-relay layer 707, electrons can be transferred easily and the light-emitting element can be driven at lower voltage.

In the case where a donor substance is included in the electron-relay layer 707, in addition to the materials described above as the substance having a high electron-transport property, a substance having a LUMO level greater than the acceptor level of the acceptor substance included in the composite material layer 708 can be used. Specifically, it is preferable to use a substance having a LUMO level higher than or equal to −5.0 eV, preferably higher than or equal to −5.0 eV and lower than or equal to −3.0 eV. Examples of such a substance, a perylene derivative are nitrogen-containing condensed aromatic compounds and the like. Note that a nitrogen-containing condensed aromatic compound is preferably used for the electron-relay layer 707 because of its stability.

Note that in the case where a donor substance is included in the electron-relay layer 707, the electron-relay layer 707 may be formed by a method such as co-evaporation of the substance having a high electron-transport property and the donor substance.

The hole-injection layer 701, the hole-transport layer 702, the layer 703 containing a light-emitting organic compound, and the electron-transport layer 704 may be formed using the above-described materials.

In the above manner, the EL layer 505 of this embodiment can be manufactured.

This embodiment can be combined with any of the other embodiments disclosed in this specification as appropriate.

(Embodiment 5)

In this embodiment, examples of an electronic device or a lighting device using an light-emitting device in accordance with one embodiment of the present invention will be described with reference to FIGS. 11A to 11E and FIGS. 12A to 12C.

Examples of the electronic device to which the light-emitting device is applied are television devices (also referred to as TV or television receivers), monitors for computers and the like, cameras such as digital cameras and digital video cameras, digital photo frames, mobile phone sets (also referred to as portable mobile phones or telephone devices), portable game machines, portable information terminals, audio playback devices, large game machines such as pachinko machines, and the like. Specific examples of the electronic device are illustrated in FIGS. 11A to 11E.

Figure 11A:
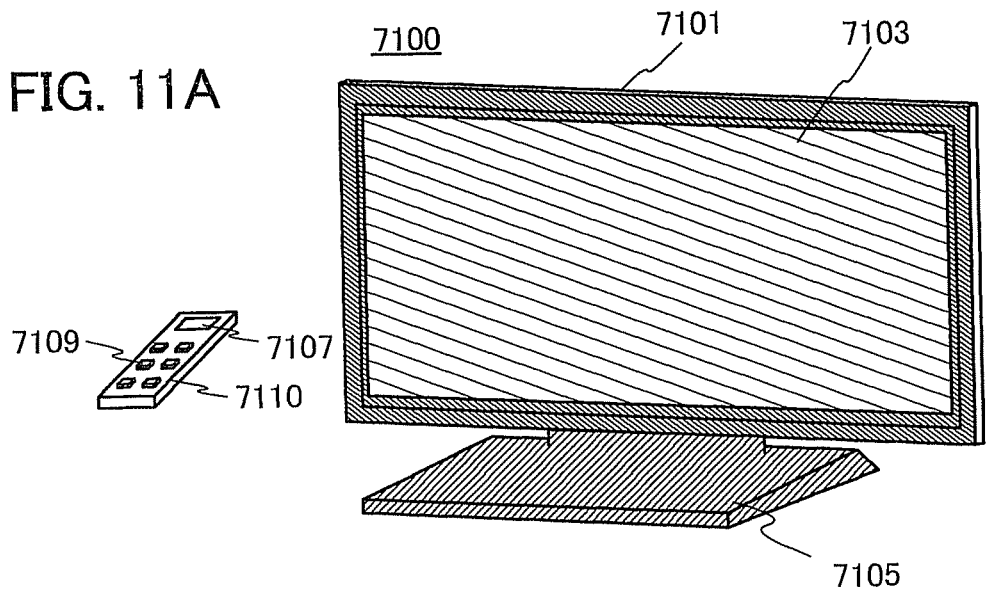
FIGS. 11A to 11E each show an application example of a light-emitting device of one embodiment of the present invention.

FIG. 11A shows an example of a television device. In a television device 7100, a display portion 7103 is incorporated in a housing 7101. Images can be displayed on the display portion 7103, and the light-emitting device can be used for the display portion 7103. Here, the housing 7101 is supported by a stand 7105.

The television device 7100 can be operated with an operation switch of the housing 7101 or a separate remote controller 7110. With operation keys 7109 of the remote controller 7110, channels and volume can be controlled and images displayed on the display portion 7103 can be controlled. The remote controller 7110 may have a display portion 7107 for displaying data output from the remote controller 7110.

Note that the television device 7100 is provided with a receiver, a modem, and the like. A general television broadcast can be received with the receiver. When the television device 7100 is connected to a communication network with or without wires via the modem, one-way (from a sender to a receiver) or two-way (between a sender and a receiver or between receivers) information communication can be performed.

Figure 11B:
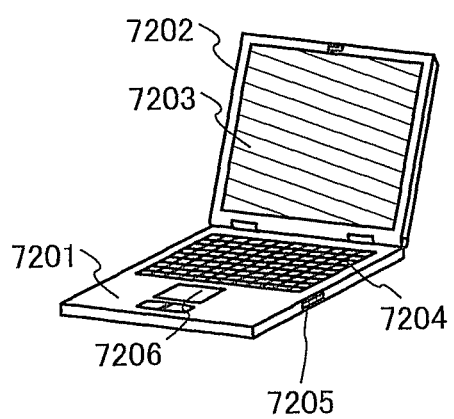

FIG. 11B shows a computer that includes a main body 7201, a housing 7202, a display portion 7203, a keyboard 7204, an external connection port 7205, a pointing device 7206, and the like. This computer is manufactured using the light-emitting device for the display portion 7203.

Figure 11C:
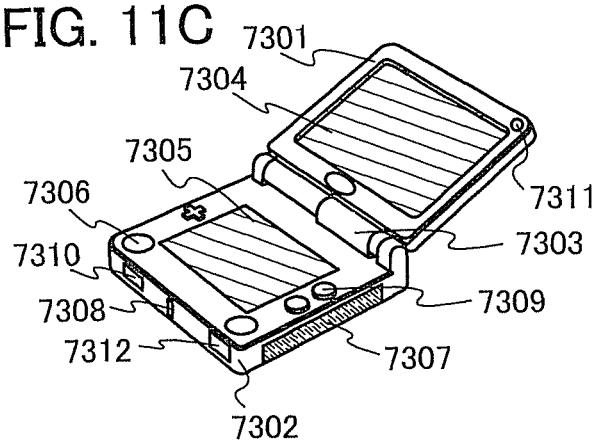

FIG. 11C shows a portable game machine that includes two housings, a housing 7301 and a housing 7302, which are connected with a joint portion 7303 so that the portable game machine can be opened or folded. A display portion 7304 is incorporated in the housing 7301, and a display portion 7305 is incorporated in the housing 7302. The portable game machine in FIG. 11C also includes a speaker portion 7306, a recording medium insertion portion 7307, an LED lamp 7308, input units (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, tilt angle, vibration, smell, or infrared rays), and a microphone 7312), and the like. Needless to say, without limitation to the above structure, the portable game machine can include other accessories as appropriate as long as the light-emitting device is used for at least one of the display portions 7304 and 7305. The portable game machine in FIG. 11C has a function of reading a program or data stored in a recording medium to display it on the display portion, and a function of sharing information with another portable game machine by wireless communication. The portable game machine in FIG. 11C can have a variety of functions without limitation to the above functions.

Figure 11D:
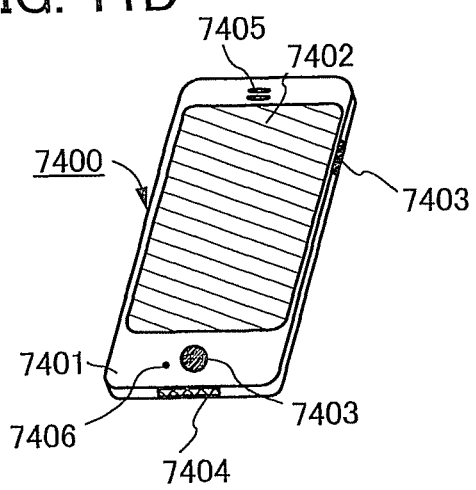

FIG. 11D shows an example of a mobile phone. A mobile phone set 7400 includes a display portion 7402 incorporated in a housing 7401, an operation button 7403, an external connection port 7404, a speaker 7405, a microphone 7406, and the like. The mobile phone set 7400 is manufactured using the light-emitting device for the display portion 7402.

When the display portion 7402 is touched with a finger or the like, data can be input into the mobile phone set 7400 in FIG. 11D. Operations such as making a call and creating an e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a character input mode mainly for inputting a character is selected for the display portion 7402 so that a character displayed on a screen can be input. In this case, it is preferable to display a keyboard or number buttons on almost all the area of the screen of the display portion 7402.

When a detection device including a sensor for detecting inclination, such as a gyroscope or an acceleration sensor, is provided inside the mobile phone set 7400, display on the screen of the display portion 7402 can be automatically changed by determining the orientation of the mobile phone set 7400 (whether the mobile phone set is placed horizontally or vertically for a landscape mode or a portrait mode).

The screen modes are switched by touching the display portion 7402 or operating the operation button 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled to be switched from the input mode to the display mode.

The display portion 7402 may function as an image sensor. For example, an image of a palm print, a fingerprint, or the like is taken by touching the display portion 7402 with the palm or the finger, whereby personal authentication can be performed. Further, by providing a backlight or a sensing light source which emits a near-infrared light in the display portion, an image of a finger vein, a palm vein, or the like can also be taken.

Figure 11E:
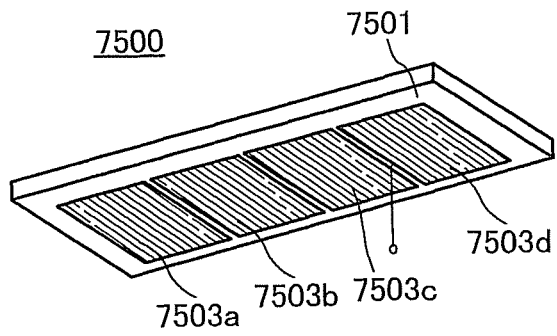

FIG. 11E shows an example of the lighting device. In a lighting device 7500, light-emitting devices 7503a to 7503d of one embodiment of the present invention are incorporated in a housing 7501 as light sources. The lighting device 7500 can be attached to a ceiling, a wall, or the like.

Further, the lighting device includes a light-emitting panel that emits light of a pale color which has high brightness and causes less eyestrain even after long-time use, light of a bright red color, and light of a bright color different from these colors. By adjustment of conditions under which light-emitting elements are driven for each emission color, a lighting device whose hue can be adjusted by a user can be achieved.

Figure 12A:
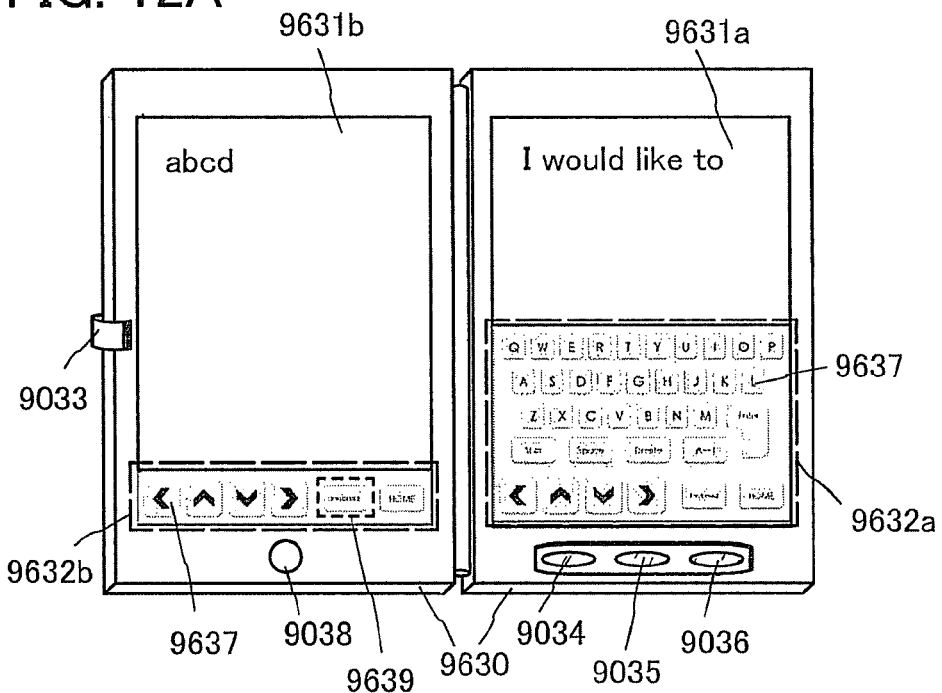
FIGS. 12A to 12C show an application example of a light-emitting device of one embodiment of the present invention.
Figure 12B:
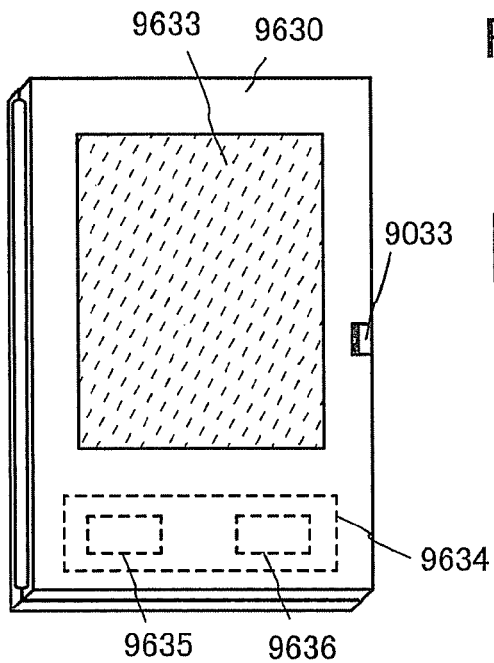

FIGS. 12A and 12B show a tablet terminal that can be folded. In FIG. 12A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038. The tablet terminal is manufactured using the light-emitting device for one or both of the display portion 9631a and the display portion 9631b.

A touch panel region 9632a can be provided in a part of the display portion 9631a, in which area, data can be input by touching displayed operation keys 9637. Note that half of the display portion 9631a has only a display function and the other half has a touch panel function. However, one embodiment of the present invention is not limited to this structure, and the whole display portion 9631a may have a touch panel function. For example, a keyboard can be displayed on the whole display portion 9631a to be used as a touch panel, and the display portion 9631b can be used as a display screen.

A touch panel region 9632b can be provided in part of the display portion 9631b like in the display portion 9631a. When a keyboard display switching button 9639 displayed on the touch panel is touched with a finger, a stylus, or the like, a keyboard can be displayed on the display portion 9631b.

The touch panel region 9632a and the touch panel region 9632b can be controlled by touch input at the same time.

The display-mode switching button 9034 allows switching between a landscape mode and a portrait mode, between color display and black-and-white display, and the like. With the power-saving-mode switching button 9036, the display luminance can be optimized in accordance with the amount of external light in use which is detected by an optical sensor incorporated in the tablet terminal. In addition to the optical sensor, other detecting devices such as sensors for detecting inclination, like a gyroscope or an acceleration sensor, may be incorporated in the tablet terminal.

Although the display portion 9631a and the display portion 9631b have the same display area in FIG. 12A, one embodiment of the present invention is not limited to this example. The display portion 9631a and the display portion 9631b may have different areas or different display quality. For example, one display panel may be capable of higher-definition display than the other display panel.

FIG. 12B shows the tablet terminal folded, which includes the housing 9630, a solar battery 9633, a charge and discharge control circuit 9634, a battery 9635, and a DCDC converter 9636. Note that in FIG. 12B, an example in which the charge and discharge control circuit 9634 includes the battery 9635 and the DCDC converter 9636 is illustrated.

Since the tablet terminal can be folded, the housing 9630 can be closed when not in use. Thus, the display portions 9631a and 9631b can be protected, which makes it possible to provide a tablet terminal with high durability and improved reliability for long-term use.

The tablet terminal shown in FIGS. 12A and 12B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on the surface of the tablet terminal, supplies electric power to a touch panel, a display portion, an image signal processor, and the like. Note that the solar battery 9633 can be provided on one or both surfaces of the housing 9630, and thus, the battery 9635 can be charged efficiently. The use of a lithium ion battery as the battery 9635 is advantageous in downsizing or the like.

Figure 12C:
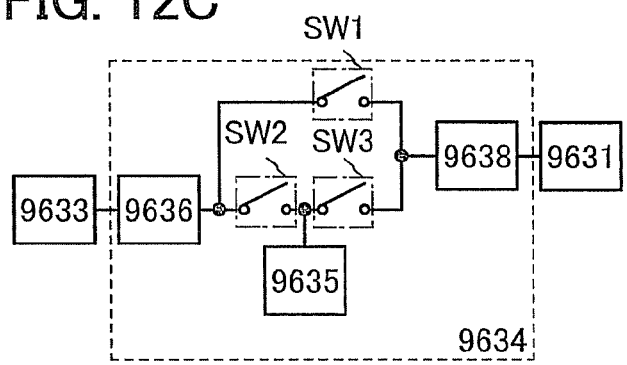

The structure and operation of the charge and discharge control circuit 9634 shown in FIG. 12B are described with reference to a block diagram of FIG. 12C. FIG. 12C shows the solar battery 9633, the battery 9635, the DCDC converter 9636, a converter 9638, switches SW1 to SW3, and the display portion 9631. The battery 9635, the DCDC converter 9636, the converter 9638, and the switches SW1 to SW3 correspond to the charge and discharge control circuit 9634 in FIG. 12B.

First, an example of the operation in the case where power is generated by the solar battery 9633 using external light is described. The voltage of power generated by the solar battery is raised or lowered by the DCDC converter 9636 so that a voltage for charging the battery 9635 can be obtained. When the display portion 9631 is operated with the power from the solar battery 9633, the switch SW1 is turned on and the voltage of the power is raised or lowered by the converter 9638 to a voltage needed for operating the display portion 9631. When display is not performed on the display portion 9631, the switch SW1 is turned off and the switch SW2 is turned on so that the battery 9635 can be charged.

Although the solar battery 9633 is shown as an example of a charge unit, there is no particular limitation on the charge unit and the battery 9635 may be charged with another unit such as a piezoelectric element or a thermoelectric conversion element (Peltier element). For example, the battery 9635 may be charged with a non-contact power transmission module which is capable of charging by transmitting and receiving power by wireless (without contact), or another charge unit used in combination.

It is needless to say that one embodiment of the present invention is not limited to the electronic devices illustrated in FIGS. 11A to 11E and FIGS. 12A to 12C as long as any of the light-emitting devices described in the above embodiment is included.

The sealed body and the method for manufacturing the sealed body, which are one embodiment of the present invention, can be used for the display device described as an example in this embodiment. Therefore, a light-emitting device, such as an electronic device or a lighting device the display device, which has extremely high reliability can be provided with high productivity.

This embodiment can be combined with any of the other embodiments disclosed in this specification as appropriate.

This application is based on Japanese Patent Application serial No. 2011-259401 filed with Japan Patent Office on Nov. 28, 2011, the entire contents of which are hereby incorporated by reference.

What is claimed is:

1. A method for manufacturing a sealed body, comprising the steps of:
    providing a first glass sheet and a second glass sheet over a first substrate so that the first glass sheet and the second glass sheet do not overlap with each other;
    applying a frit paste including a glass frit and a binder so that a layer of the frit paste is in contact with a first side surface of the first glass sheet and a side surface of the second glass sheet;
    forming a glass layer by heating the layer of the frit paste to remove the binder from the layer of the frit paste;
    bonding a second substrate and the first substrate in a position in which the second substrate is in contact with a top surface of the first glass sheet, a top surface of the second glass sheet, and a top surface of the glass layer such that the second substrate does not overlap a part of the top surface of the first glass sheet; and
    irradiating in the position the first glass sheet, the second glass sheet, and the glass layer with laser light,
    wherein irradiating the first glass sheet with the laser light is conducted by oblique irradiation such that a second side surface of the first glass sheet and the part of the top surface of the first glass sheet are irradiated with the laser light.

2. A method for manufacturing a sealed body, comprising the steps of:
    providing a first glass sheet, a second glass sheet, a third glass sheet, and a fourth glass sheet over a first substrate so that the first glass sheet, the second glass sheet, the third glass sheet, and the fourth glass sheet do not overlap with each other;
    applying a frit paste including a glass frit and a binder so that one of layers of the frit paste is in contact with a first side surface of the first glass sheet and a side surface of the second glass sheet; and
    forming glass layers by heating the layers of the frit paste to remove the binder from the layers of the frit paste,
    bonding a second substrate and the first substrate in a position in which the second substrate is in contact with a top surface of the first glass sheet, a top surface of the second glass sheet, a top surface of the third glass sheet, a top surface of the fourth glass sheet, and top surfaces of the glass layers such that the second substrate does not overlap a part of the top surface of the first glass sheet; and
    irradiating in the position the first glass sheet, the second glass sheet, the third glass sheet, the fourth glass sheet, and the glass layers with laser light,
    wherein irradiating the first glass sheet with the laser light is conducted by oblique irradiation such that a second side surface of the first glass sheet and the part of the top surface of the first glass sheet are irradiated with the laser light.

3. A method for manufacturing a sealed body, comprising the steps of:
    providing a plurality of glass sheets over a first substrate;
    applying a frit paste including a glass frit and a binder so that each of a plurality of layers of the frit paste is in contact with side surfaces facing each other of two of the plurality of glass sheets, which are adjacent;
    forming a plurality of glass layers by heating the plurality of layers of the frit paste to remove the binder from each of the plurality of layers of the frit paste;
    bonding a second substrate and the first substrate in a position in which the second substrate is in contact with top surfaces of the plurality of glass sheets and top surfaces of the plurality of glass layers such that the second substrate does not overlap a part of the top surface of at least one of the plurality of glass sheets; and
    irradiating in the position the plurality of glass sheets and the plurality of glass layers with laser light,
    wherein irradiating the one of the plurality of glass sheets with the laser light is conducted by oblique irradiation such that another side surface of the one of the plurality of glass sheets and the part of the top surface of one of the plurality of glass sheets are irradiated with the laser light.

4. The method for manufacturing a sealed body according to claim 1,
    wherein the binder comprises an organic resin.

5. The method for manufacturing a sealed body according to claim 2,
wherein the binder comprises an organic resin.

6. The method for manufacturing a sealed body according to claim 3,
wherein the binder comprises an organic resin.

7. The method for manufacturing a sealed body according to claim 1,
wherein forming the glass layer is performed by providing an electrically conductive material over the fit paste and by induction heating.

8. The method for manufacturing a sealed body according to claim 2,
wherein forming the glass layers is performed by providing an electrically conductive material over the frit paste and by induction heating.

9. The method for manufacturing a sealed body according to claim 3,
wherein forming the plurality of glass layers is performed by providing an electrically conductive material over the fit paste and by induction heating.

10. The method for manufacturing a sealed body according to claim 1,
wherein a thickness of the first glass sheet and a thickness of the second glass sheet are greater than or equal to 3 μm and less than or equal to 100 μm.

11. The method for manufacturing a sealed body according to claim 2,
wherein thicknesses of each of the first glass sheet, the second glass sheet, the third glass sheet, and the fourth glass sheet are greater than or equal to 3 μm and less than or equal to 100 μm.

12. The method for manufacturing a sealed body according to claim 3,
wherein a thickness of the plurality of glass sheets are greater than or equal to 3 μm and less than or equal to 100 μm.

13. The method for manufacturing a sealed body according to claim 1,
wherein a light-emitting element is provided in a closed space -surrounded by the first substrate, the second substrate, the first glass sheet, the second glass sheet.

14. The method for manufacturing a sealed body according to claim 2,
wherein a light-emitting element is provided in a closed space surrounded by the first substrate, the second substrate, the first glass sheet, the second glass sheet, the third glass sheet, the fourth glass sheet.

15. The method for manufacturing a sealed body according to claim 3,
wherein a light-emitting element is provided in a closed space surrounded by the first substrate, the second substrate, the plurality of glass sheets.

16. The method for manufacturing a sealed body according to claim 1,
wherein the first glass sheet and the second glass sheet are provided over the first substrate by pulling out a glass sheet wound on a reel and cutting the glass sheet pulled out.

17. The method for manufacturing a sealed body according to claim 2,
wherein the first glass sheet, the second glass sheet, the third glass sheet and the fourth glass sheet are provided over the first substrate by pulling out a glass sheet wound on a reel and cutting the glass sheet pulled out.

18. The method for manufacturing a sealed body according to claim 3,
wherein the plurality of glass sheets are provided over the first substrate by pulling out a glass sheet wound on a reel and cutting the glass sheet pulled out.

* * * * *